US007929070B2

(12) United States Patent
Chiang et al.

(10) Patent No.: US 7,929,070 B2
(45) Date of Patent: Apr. 19, 2011

(54) PIXEL STRUCTURES AND FABRICATING METHODS THEREOF

(75) Inventors: Chia-Ming Chiang, Taoyuan County (TW); Yuan-Hao Chang, Taipei (TW); Hsi-Ming Chang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 274 days.

(21) Appl. No.: 12/241,048

(22) Filed: Sep. 30, 2008

(65) Prior Publication Data

US 2010/0002164 A1 Jan. 7, 2010

(30) Foreign Application Priority Data

Jul. 4, 2008 (TW) ................................ 97125240 A

(51) Int. Cl.
*G02F 1/136* (2006.01)

(52) U.S. Cl. ........................................................ 349/46

(58) Field of Classification Search ......................... None
See application file for complete search history.

(56) References Cited

U.S. PATENT DOCUMENTS

| | | | | |
|---|---|---|---|---|
| 6,452,654 | B2 * | 9/2002 | Kubo et al. | 349/114 |
| 6,765,637 | B2 | 7/2004 | Takenaka | |
| 6,829,024 | B2 | 12/2004 | Park et al. | |
| 7,106,403 | B2 | 9/2006 | Murai et al. | |
| 7,119,865 | B2 * | 10/2006 | Yang et al. | 349/114 |
| 2006/0170845 | A1 * | 8/2006 | Lee | 349/114 |
| 2008/0062364 | A1 * | 3/2008 | Lee et al. | 349/113 |
| 2008/0111935 | A1 * | 5/2008 | Lee et al. | 349/43 |

* cited by examiner

*Primary Examiner* — Sung H Pak
(74) *Attorney, Agent, or Firm* — Jianq Chyun IP Office

(57) ABSTRACT

A fabricating method of a pixel structure is provided, which uses the original processes of fabricating a thin film transistor to simultaneously fabricate a reflective layer with an uneven surface. In the fabrication process of the thin film transistor, a plurality of bumps are formed under the reflective layer which is to be formed later on. The bumps and a gate of the TFT are formed simultaneously or the bumps and a semiconductor layer of the TFT are formed simultaneously. In addition, by stacking layers on the bumps, the reflective layer formed on the bumps can have good uneven shapes on the surface thereon. Therefore, the fabricating method of a pixel structure has simple processes and low manufacturing costs, and can be used for fabricating a transflective pixel structure or a reflective pixel structure.

18 Claims, 17 Drawing Sheets

PIXEL STRUCTURES AND FABRICATING METHODS THEREOF

CROSS-REFERENCE TO RELATED APPLICATION

This application claims the priority benefit of Taiwan application Ser. No. 97125240, filed on Jul. 4, 2008. The entirety of the above-mentioned patent application is hereby incorporated by reference herein and made a part of this specification.

BACKGROUND OF THE INVENTION

1. Field of the Invention

The present invention relates to a pixel structure and a fabricating method thereof, and more particularly, to a pixel structure and a fabricating method thereof in a transflective/reflective liquid crystal display (LCD).

2. Description of Related Art

Generally, LCDs can be classified into three types by different light sources, which are transmissive LCDs, reflective LCDs and transflective LCDs. With the development of portable electronics, emphasis is being placed on reflective and transflective LCDs that may utilize external light sources. However, in LCDs, when fabricating pixel structures of the conventional reflective or transflective pixel structure, fabricating a reflective layer is additionally required. Furthermore, extra fabrication processes are required to fabricate the reflective layer with an uneven surface to increase the effects of reflection of the reflective layer.

FIGS. 1A~1I are schematic cross-sectional views illustrating the conventional fabrication processes of a pixel structure of a transflective LCD. Referring to FIG. 1A, first, a substrate 110 is provided. A gate 120 is formed on the substrate 110 though a first mask process. Next, referring to FIG. 1B, a gate insulation layer 130 is formed on the substrate 110 to cover the gate 120. Then, referring to FIG. 1C, a semiconductor layer 140 is formed on the gate insulation layer 130 on top of the gate 120 through a second mask process.

Referring to FIG. 1D, a source 152, a drain 154, and a patterned semiconductor layer 140' are formed at the two sides of the semiconductor layer 140 through a third mask process. Furthermore, referring to FIG. 1E, a protection layer 160 is formed on the substrate 110 to cover the source 152, the drain 154, and the patterned semiconductor layer 140'. Next, referring to FIG. 1F, the protection layer 160 is patterned through a fourth mask process to form an opening 162 in the protection layer 160, and remove the protection layer 160 in a transparent region 164 at the same time.

Then, referring to FIG. 1G, the protection layer 160 is patterned through a fifth mask process to form a plurality of bumps 166. Referring to FIG. 1H, a reflective layer 170 is formed on the bumps 166 through a sixth mask process. Then, referring to FIG. 1I, a pixel electrode 180 which is electrically connected to the drain 154 through the opening 162 is fabricated through a seventh mask process. The fabrication of a pixel structure 100 of a conventional transflective LCD is hereby finished.

As shown in FIG. 1G, when forming the protection layer 160 as the plurality of bumps 166, an organic material has to be used to form the protection layer 160 such that the bumps 166 of high unevenness may be easily fabricated. Thus, with the exception of the material of the protection layer 160 being organic, the rest of the layers are inorganic materials. However, the characteristics of inorganic and organic materials are different, resulting in the requirement of using different fabrication parameters and a more complex fabrication process.

In addition, the abovementioned pixel structure 100 requires seven mask processes to fabricate the thin film transistor (comprising the gate 120, the source 152, as well as the drain 154) and the reflective layer 170. Hence, it is not easy to reduce the costs of the mask processes. Furthermore, it would also be difficult to raise productivity due to the higher number of fabrication processes.

SUMMARY OF THE INVENTION

The present invention provides a fabricating method of a pixel structure which may simplify the steps of fabrication process, lower the manufacturing costs, and increase productivity.

The present invention provides a pixel structure which facilitates simultaneous fabrication of a thin film transistor and a reflective layer with an uneven surface.

Based on the above, the present invention provides a fabricating method of a pixel structure including the following steps. First, a substrate is provided and comprises an active device region and a pixel region. Next, a gate and a plurality of bumps are formed on the substrate, wherein the gate is disposed in the active device region and the bumps are disposed in the pixel region. Then, a gate insulation layer is formed to cover the gate and the bumps. Afterwards, a semiconductor layer is formed on the gate insulation layer on top of the gate and the bumps. Next, a source and a drain are formed at the two sides of a patterned semiconductor layer on top of the gate. Then, a patterned protection layer is formed to cover the substrate and the patterned protection layer exposes part of the drain. After that, a pixel electrode is formed on the substrate and electrically connected to the drain. Then, at least a reflective layer is formed on the pixel electrode on top of the bumps.

In one embodiment of the present invention, the material of the reflective layer may be selected from chromium (Cr), aluminum (Al), titanium (Ti), molybdenum (Mo), tungsten (W), tantalum (Ta), copper (Cu), and a combination of the aforementioned.

In one embodiment of the present invention, the pixel region includes a reflective region and a transparent region. The bumps are disposed in the reflective region and the pixel electrode is extended from the reflective region to the transparent region.

In an embodiment of the present invention, a material of the patterned protection layer includes inorganic material.

In one embodiment of the present invention, the abovementioned step of forming the source and the drain at the two sides of the semiconductor layer on top of the gate further includes removing the part of the semiconductor layer that is on top of the gate to form a patterned semiconductor layer.

The present invention further provides a fabricating method of a pixel structure. The fabricating method includes the following steps. First, a substrate is provided and comprises an active device region and a pixel region. Next, a gate and a plurality of bumps are formed on the substrate, wherein the gate is disposed in the active device region and the bumps are disposed in the pixel region. Then, a gate insulation layer is formed to cover the gate and the bumps. Afterwards, a semiconductor layer is formed on of the gate insulation layer on top of the gate and the bumps. Then, a source and a drain are formed at the two sides of a patterned semiconductor layer on the gate and a reflective layer is formed at the same time to cover the bumps. After that, a patterned protection layer is formed to cover the substrate and the patterned protection layer exposes part of the drain. Then, a pixel electrode is formed on the substrate and electrically connected to the drain.

In one embodiment of the present invention, the reflective layer and the drain are the same layer and are interconnected.

In one embodiment of the present invention, the material of the reflective layer may be selected from chromium (Cr), aluminum (Al), titanium (Ti), molybdenum (Mo), tungsten (W), tantalum (Ta), copper (Cu), and a combination of the aforementioned.

In one embodiment of the present invention, the pixel region includes a reflective region and a transparent region. The bumps are disposed in the reflective region and the pixel electrode is extended from the reflective region to the transparent region.

In one embodiment of the present invention, a material of the patterned protection layer includes inorganic material.

In one embodiment of the present invention, the abovementioned step of forming the source and the drain at the two sides of the semiconductor layer on top of the gate further includes removing the part of the semiconductor layer that is on top of the gate to form a patterned semiconductor layer.

The present invention further provides a pixel structure comprising a substrate, a gate, a plurality of bumps, a gate insulation layer, a patterned semiconductor layer, a source as well as a drain, a patterned protection layer, a pixel electrode, and a reflective layer. The substrate includes an active device region and a pixel region. The gate and the bumps are disposed on the substrate, wherein the gate is disposed in the active device region and the bumps are disposed in the pixel region. The gate insulation layer covers the gate and the bumps. The patterned semiconductor layer is disposed on the gate insulation layer on top of the gate and the bumps. The source and the drain are disposed at the two sides of the patterned semiconductor layer on top of the gate. The patterned protection layer covers the substrate and exposes part of the drain. The pixel electrode is disposed in the pixel region and electrically connected to the drain. The reflective layer is disposed either on the pixel electrode on top of the bumps or between the patterned semiconductor layer and the patterned protection layer which are also on top of the bumps.

In one embodiment of the present invention, when the reflective layer is disposed between the patterned semiconductor layer and the patterned protection layer which are on top of the bumps, the reflective layer and the drain are the same layer, and are electrically connected.

In one embodiment of the present invention, the material of the reflective layer may be selected from chromium (Cr), aluminum (Al), titanium (Ti), molybdenum (Mo), tungsten (W), tantalum (Ta), copper (Cu), and a combination of the aforementioned.

In one embodiment of the present invention, the pixel region includes a reflective region and a transparent region. The bumps are disposed in the reflective region and the pixel electrode is extended from the reflective region to the transparent region.

In one embodiment of the present invention, a material of the patterned protection layer includes inorganic material.

The present invention further provides a fabricating method of a pixel structure. The fabricating method includes the following steps. First, a substrate is provided comprising an active device region and a pixel region. Next, a gate is formed on the substrate and in the active device region. Then, a gate insulation layer is formed to cover the gate. Afterwards, a semiconductor layer is formed on the gate insulation layer, wherein the semiconductor layer comprises a channel layer and a plurality of bumps. The channel layer is disposed on the gate insulation layer on top of the gate and the bumps are disposed on the gate insulation layer in the pixel region. Then, a source and a drain are formed at the two sides of the channel layer and a reflective layer is formed at the same time to cover the bumps. After that, a patterned protection layer is formed to cover the substrate and the patterned protection layer exposes part of the drain. Then, a pixel electrode is formed on the substrate and electrically connected to the drain.

In one embodiment of the present invention, the reflective layer and the drain are the same layer and are interconnected.

In one embodiment of the present invention, the material of the reflective layer may be selected from chromium (Cr), aluminum (Al), titanium (Ti), molybdenum (Mo), tungsten (W), tantalum (Ta), copper (Cu), and a combination of the aforementioned.

In one embodiment of the present invention, the pixel region includes a reflective region and a transparent region. The bumps are disposed in the reflective region and the pixel electrode is extended from the reflective region to the transparent region.

In one embodiment of the present invention, a material of the patterned protection layer includes inorganic material.

In one embodiment of the present invention, the abovementioned step of forming the source and the drain at the two sides of the channel layer and simultaneously forming a reflective layer to cover the bumps further includes removing the part of the semiconductor layer that is on top of the gate to form a patterned semiconductor layer.

The present invention further provides a pixel structure comprising a substrate, a gate, a gate insulation layer, a patterned semiconductor layer, a source as well as a drain, a patterned protection layer, a pixel electrode, and a reflective layer. The substrate includes an active device region and a pixel region. The gate is disposed on the substrate and in the active device region. The gate insulation layer covers the gate. The patterned semiconductor layer is formed on the gate insulation layer, wherein the patterned semiconductor layer comprises a channel layer and a plurality of bumps. The channel layer is disposed on the gate insulation layer on top of the gate and the bumps are disposed on the gate insulation layer in the pixel region. The source and the drain are disposed at the two sides of the channel layer. The patterned protection layer covers the substrate and exposes part of the drain. The pixel electrode is disposed on the substrate and electrically connected to the drain. The reflective layer covers the bumps and is disposed between the bumps and the patterned protection layer.

In one embodiment of the present invention, the reflective layer and the drain are the same layer, and are interconnected.

In one embodiment of the present invention, the material of the reflective layer may be selected from chromium (Cr), aluminum (Al), titanium (Ti), molybdenum (Mo), tungsten (W), tantalum (Ta), copper (Cu), and a combination of the aforementioned.

In one embodiment of the present invention, the pixel region includes a reflective region and a transparent region. The bumps are disposed in the reflective region and the pixel electrode is extended from the reflective region to the transparent region.

In one embodiment of the present invention, a material of the patterned protection layer includes inorganic material.

The fabricating method of a pixel structure of the present invention uses five mask processes to accomplish the fabrication of a thin film transistor and fabricate an uneven surface of the reflective layer. Therefore, the fabricating method may be simplified, the costs of mask processes may be lowered, and the productivity may be raised. In addition, by using the abovementioned fabricating method of a pixel structure, a thin film transistor and a reflective layer with an uneven surface may be fabricated at the same time.

In order to make the aforementioned features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1I are schematic cross-sectional views illustrating the conventional fabrication processes of a pixel structure of a transflective LCD.

DESCRIPTION OF EMBODIMENTS

In all the embodiments below, the fabricating method of a pixel structure in the present invention is suitable for fabricating a transflective pixel structure or a reflective pixel structure. The figures below illustrate the transflective pixel structure as an example. However, the present invention is not limited to the fabricating method of the transflective pixel structure.

The First Embodiment

FIGS. 2A~2H are schematic cross-sectional views illustrating the fabrication processes of a pixel structure according to the first embodiment of the present invention. FIGS. 2A~2H are referenced in sequence in the following.

Figure 1A:
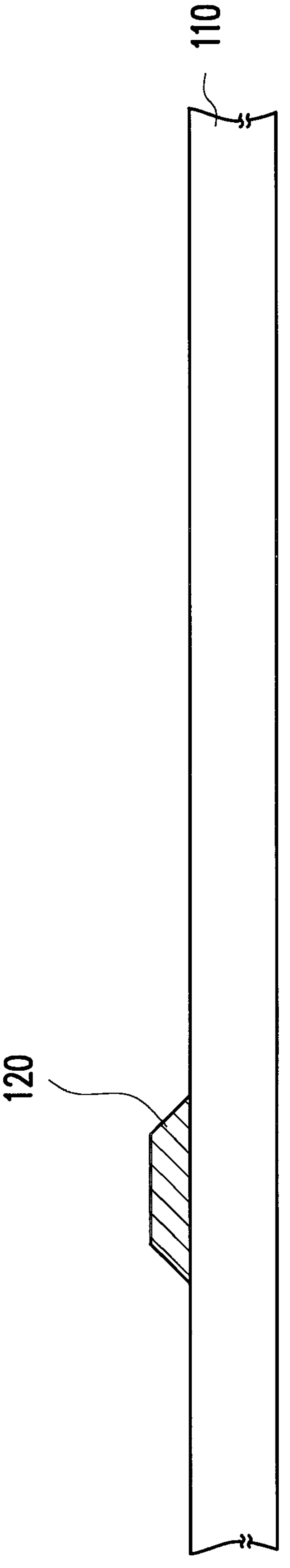
Figure 1B:
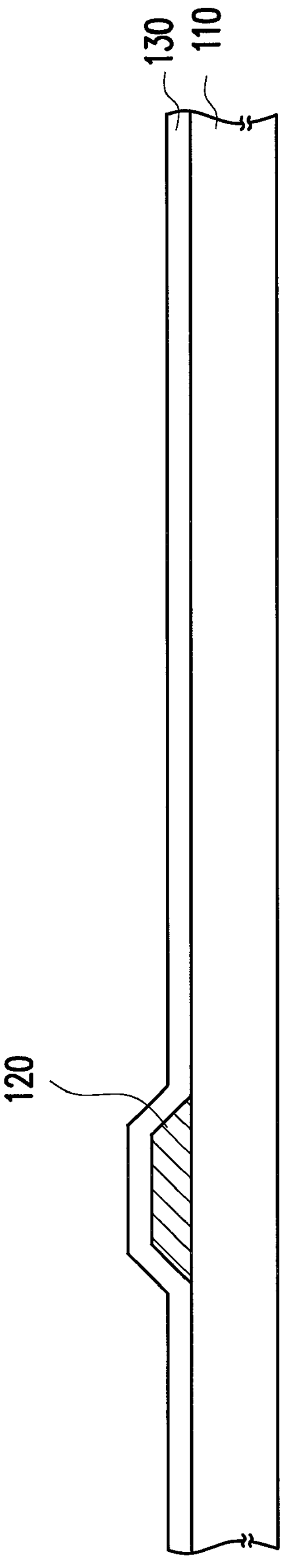
Figure 1C:
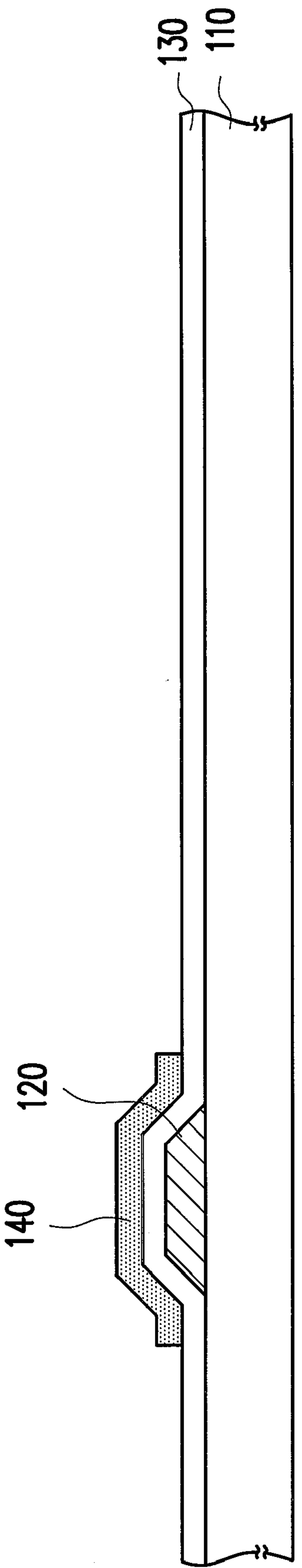
Figure 1D:
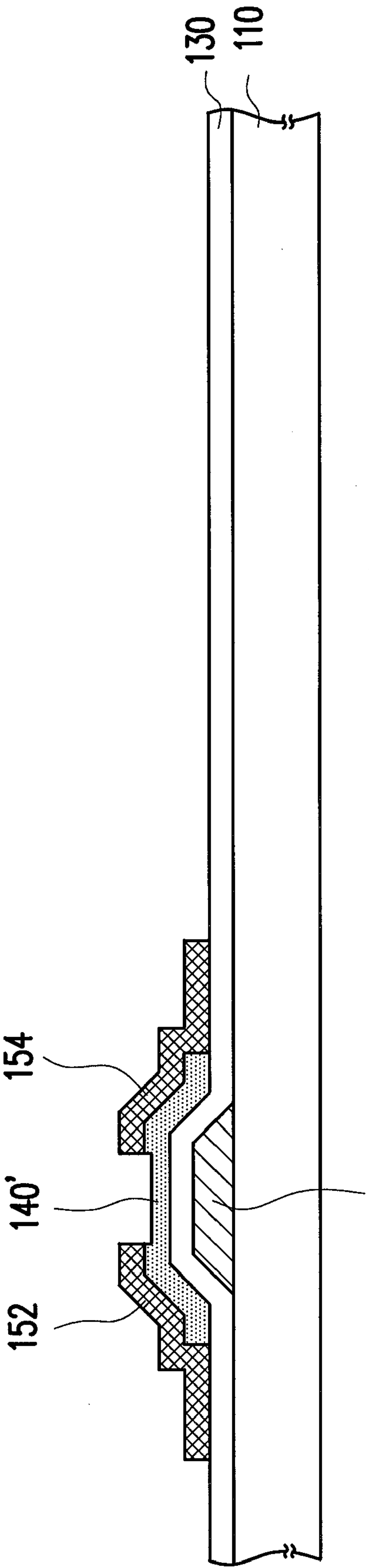
Figure 1E:
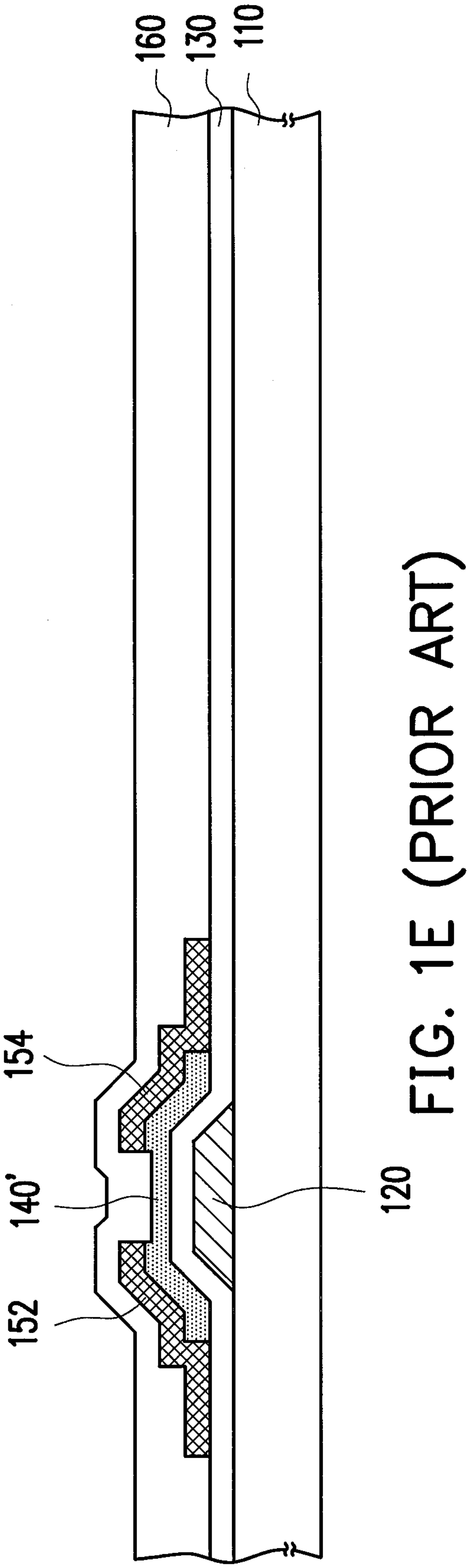
Figure 1F:
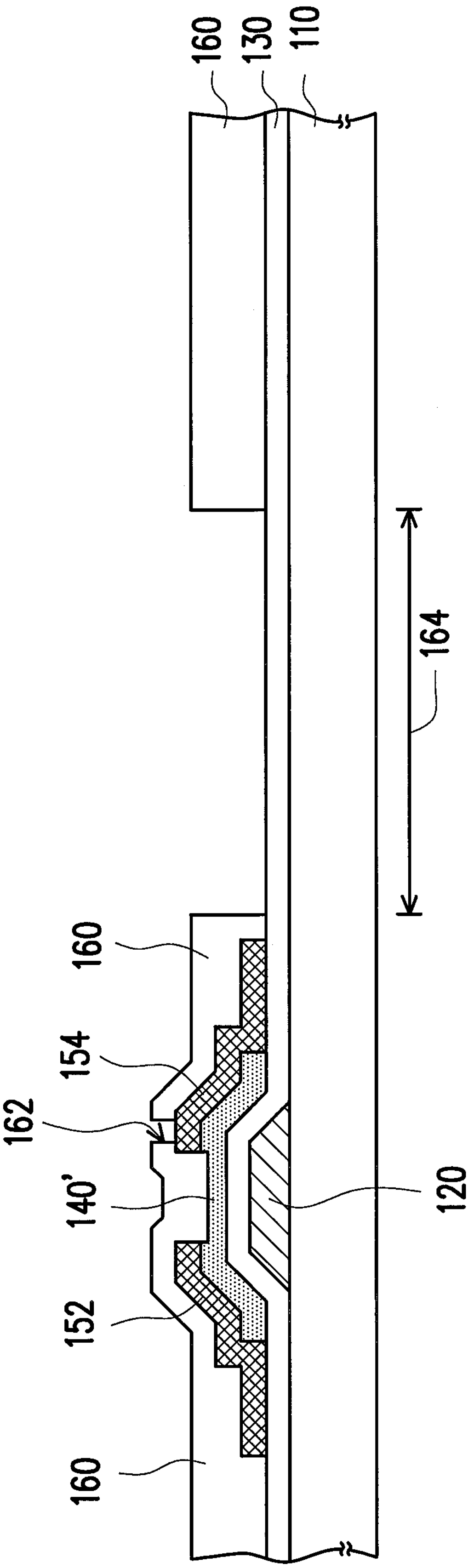
Figure 1G:
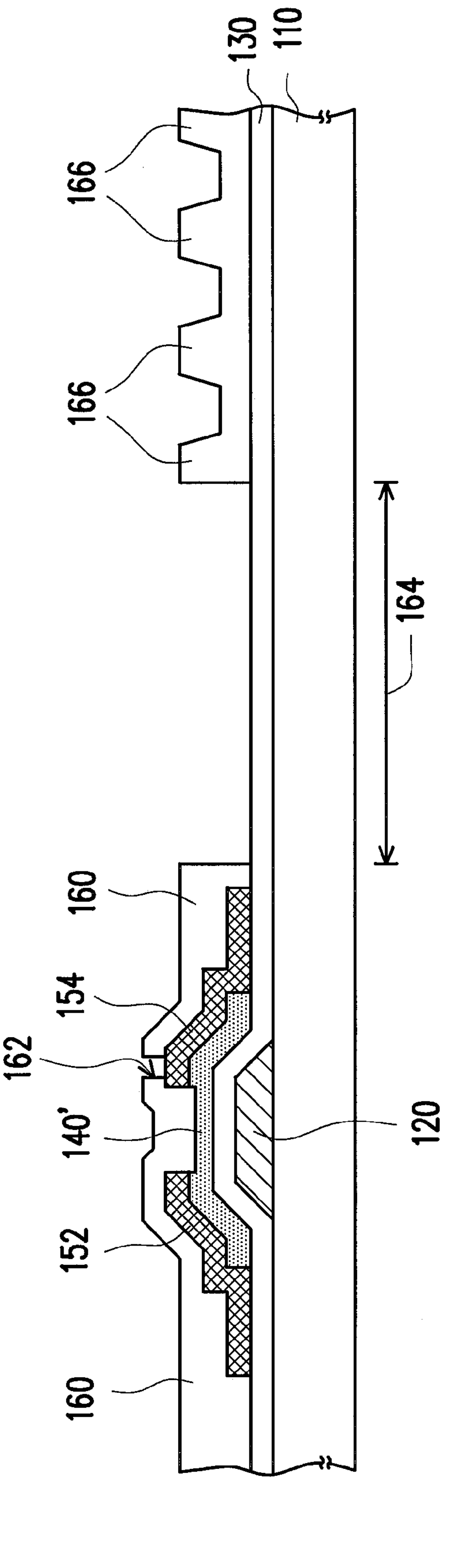
Figure 1H:
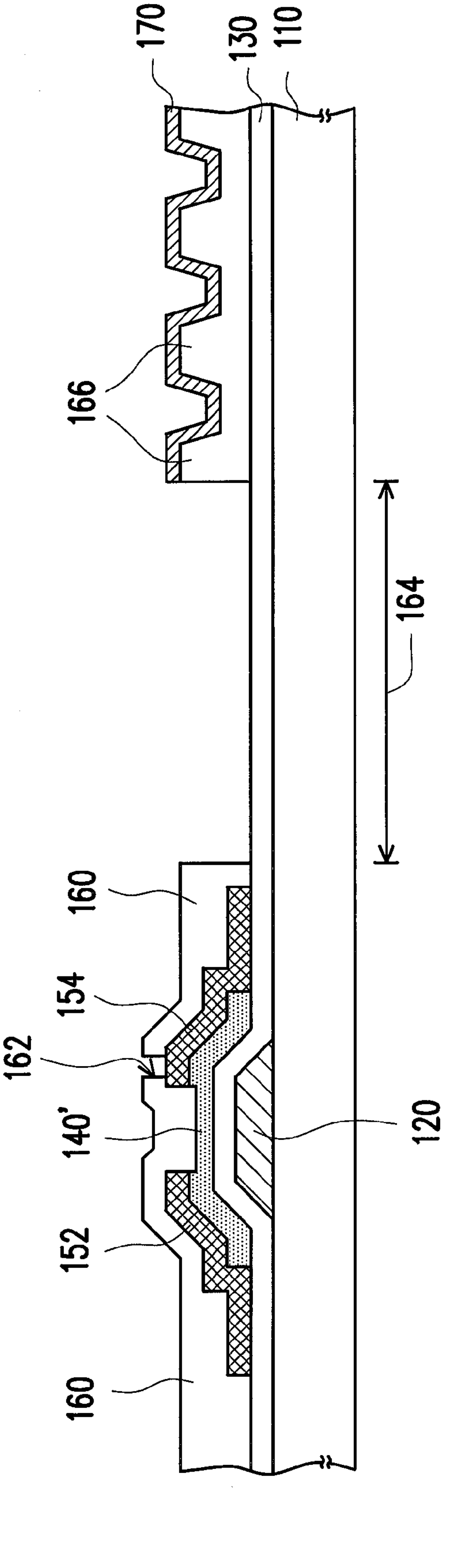
Figure 11:
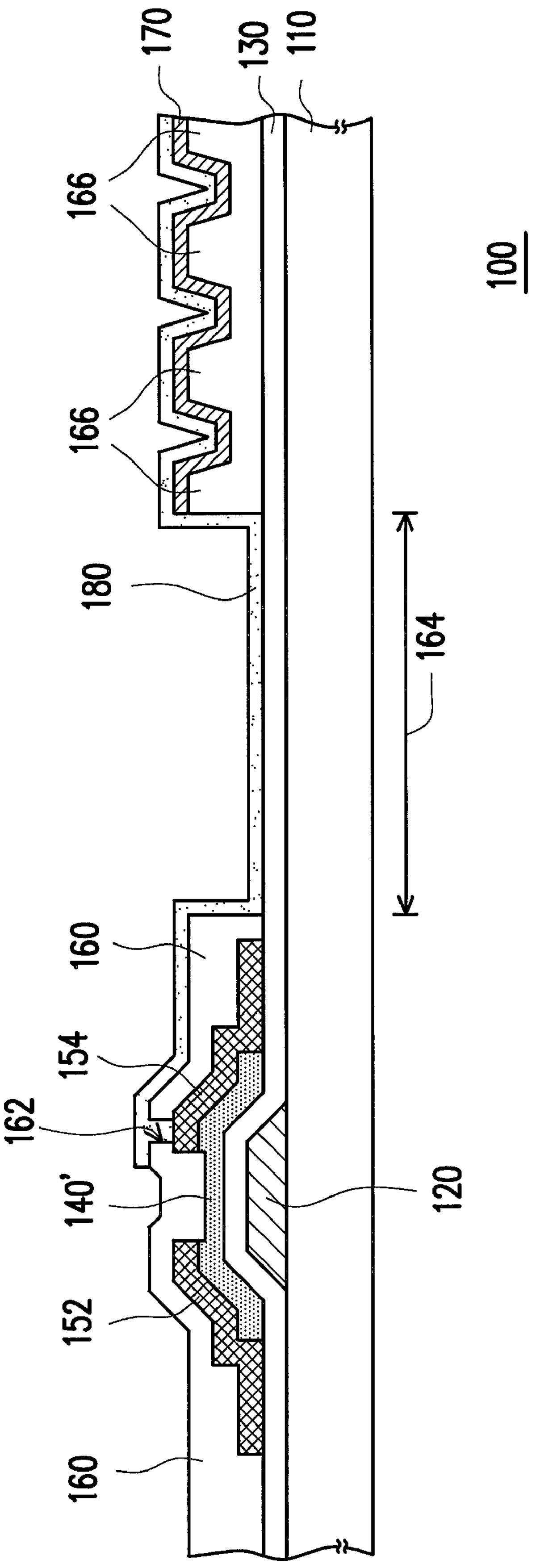
Figure 2A:
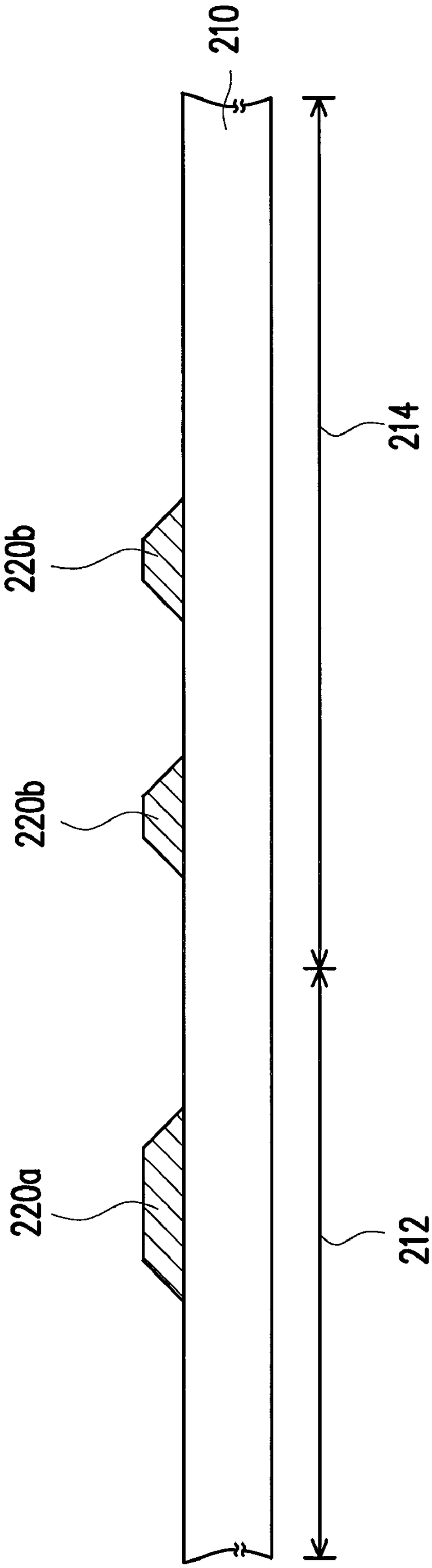
FIGS. 2A~2H are schematic cross-sectional views illustrating the fabrication processes of a pixel structure according to the first embodiment of the present invention.

First, referring to FIG. 2A, a substrate 210 is provided and the substrate 210 comprises an active device region 212 and a pixel region 214. The substrate 210 may be a glass substrate, a silicon substrate, or a substrate of any other similar materials. Next, a gate 220*a* and a plurality of bumps 220*b* are formed on the substrate 210, wherein the gate 220*a* is disposed in the active device region 212 and the bumps 220*b* are disposed in the pixel region 214. The gate 220*a* and the bumps 220*b* are fabricated through a first mask process. The material of the gate 220*a* and the bumps 220*b* may be selected from chromium (Cr), aluminum (Al), titanium (Ti), molybdenum (Mo), tungsten (W), tantalum (Ta), copper (Cu), and a combination of the aforementioned, for example.

Figure 2B:
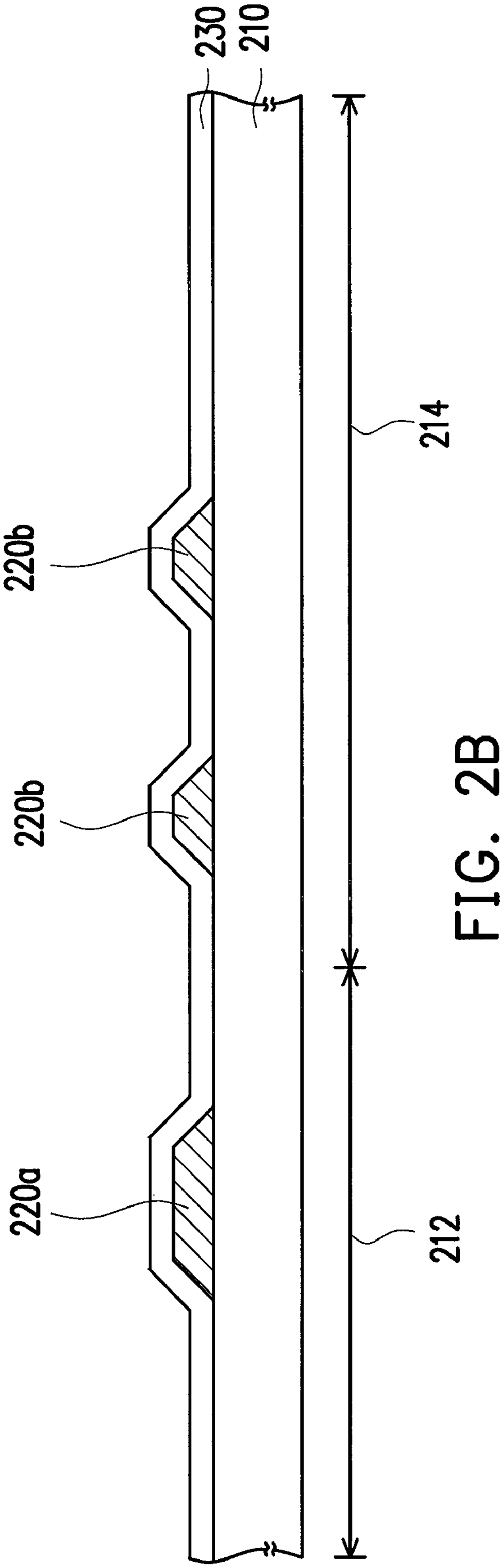

Next, referring to FIG. 2B, a gate insulation layer 230 is formed to cover the gate 220*a* and the bumps 220*b*. The method of forming the gate insulation layer 230 is a chemical vapor deposition (CVD) process, for example. The material of the gate insulation layer 230 may be silicon oxide, silicon nitride, silicon nitride oxide, or other similar materials, for instance.

Figure 2C:
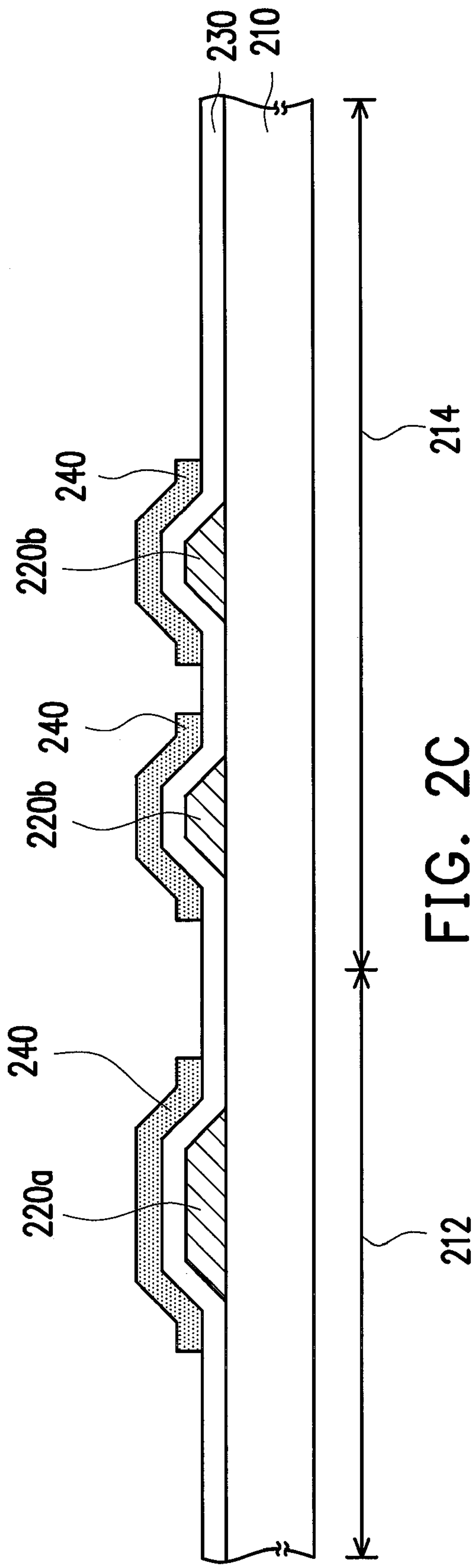

Afterwards, referring to FIG. 2C, a semiconductor layer 240 is formed on the gate insulation layer 230 on top of the gate 220*a* and the bumps 220*b*. The semiconductor layer 240 is fabricated through a second mask process. In addition, the material of the semiconductor layer 240 is amorphous silicon or polysilicon, for example.

Figure 2D:
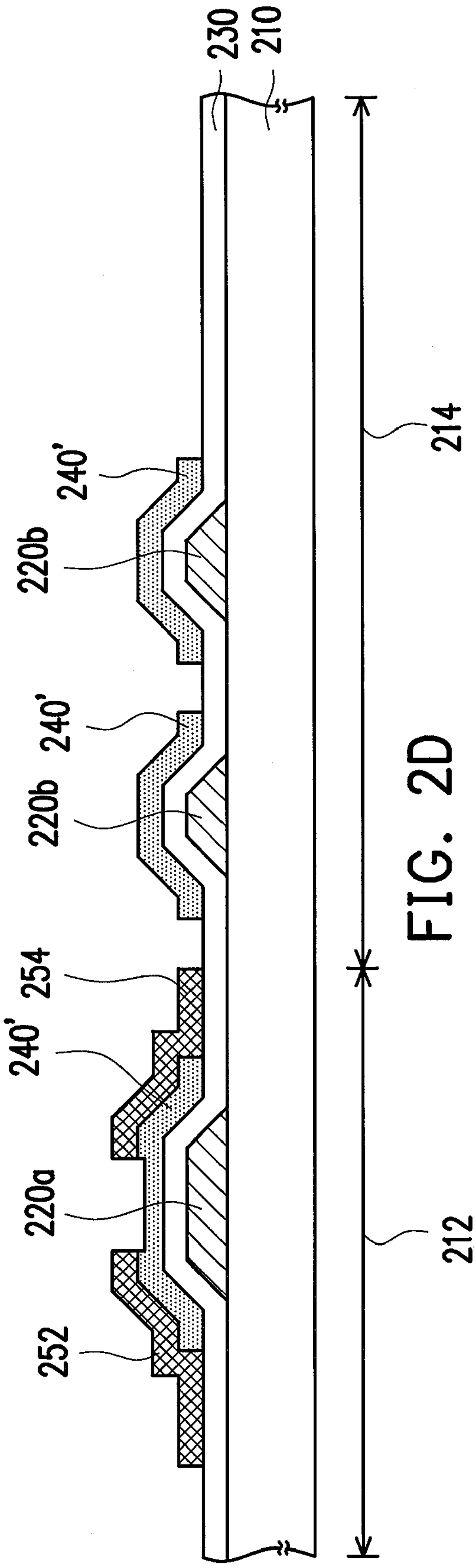

Next, referring to both FIG. 2C and FIG. 2D, a source 252 and a drain 254 are formed at the two sides of the semiconductor layer 240 on top of the gate 220*a*. The source 252 and the drain 254 are fabricated through a third mask process. Patterned semiconductor layers 240' are also formed through the said mask (i.e. through the third mask process), wherein the patterned semiconductor layer 240' on top of the gate 220*a* is a channel layer. More specifically, the step of forming the source 252 and the drain 254 at the two sides of the semiconductor layer 240 on top of the gate 220*a* further includes removing a part of the semiconductor layer 240 on top of the gate 220*a* to form the patterned semiconductor layer 240'. In addition, the material of the source 252 and the drain 254 may be selected from chromium (Cr), aluminum (Al), titanium (Ti), molybdenum (Mo), tungsten (W), tantalum (Ta), copper (Cu), and a combination of the aforementioned. In particular, the gate 220*a*, the source 252 and the drain 254 constitute a thin film transistor (TFT).

Figure 2E:
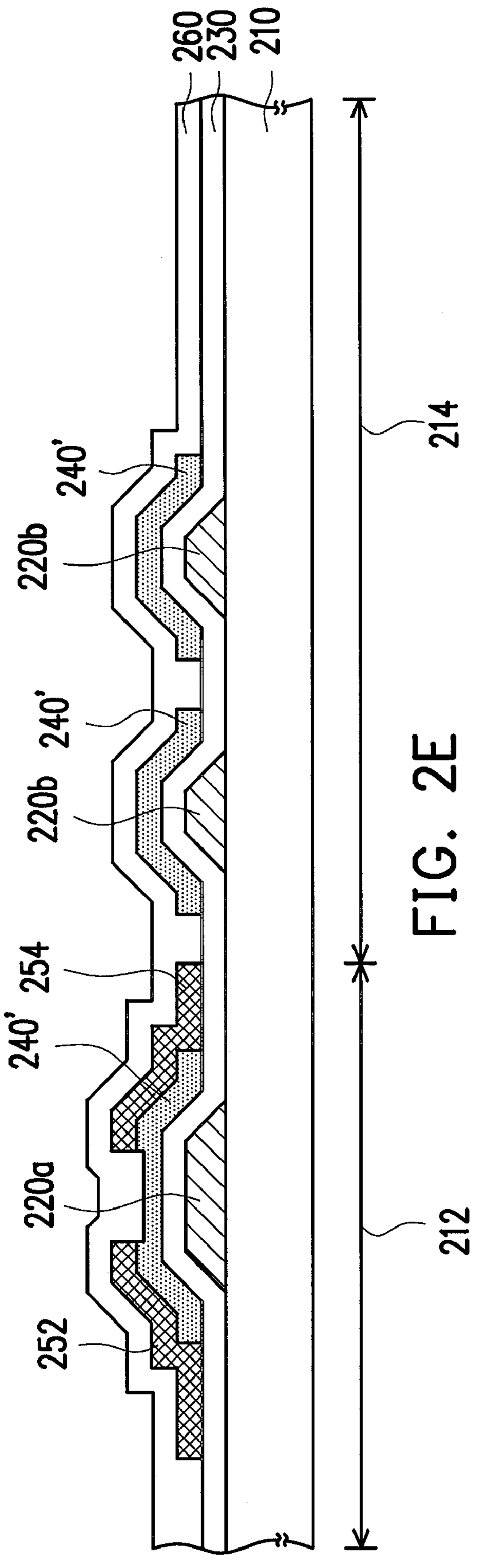
Figure 2F:
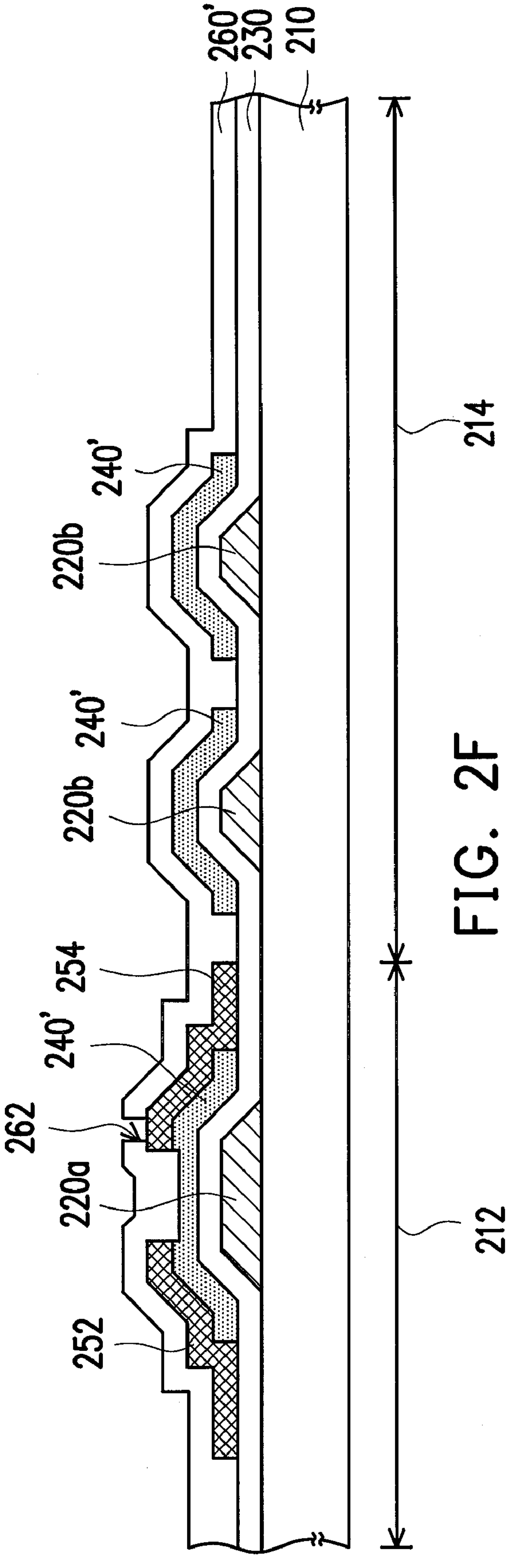

Then, referring to both FIG. 2E and FIG. 2F, a patterned protection layer 260' is formed to cover the substrate 210, and the patterned protection layer 260' exposes part of the drain 254. The material of the patterned protection layer 260' is inorganic material, for example. More specifically, as shown in FIG. 2E, first, a protection layer 260 is formed on the substrate 210 using the chemical vapor deposition process. Then, as shown in FIG. 2F, an opening 262 is formed in the protection layer 260 through a fourth mask process such that the patterned protection layer 260' exposes the drain 254.

In particular, the material of the patterned protection layer 260' is inorganic material as compared to the organic material of the protection layer 160 in the conventional method. Thus, the said step does not require changing current fabrication parameters and the fabrication process is simplified.

Figure 2G:
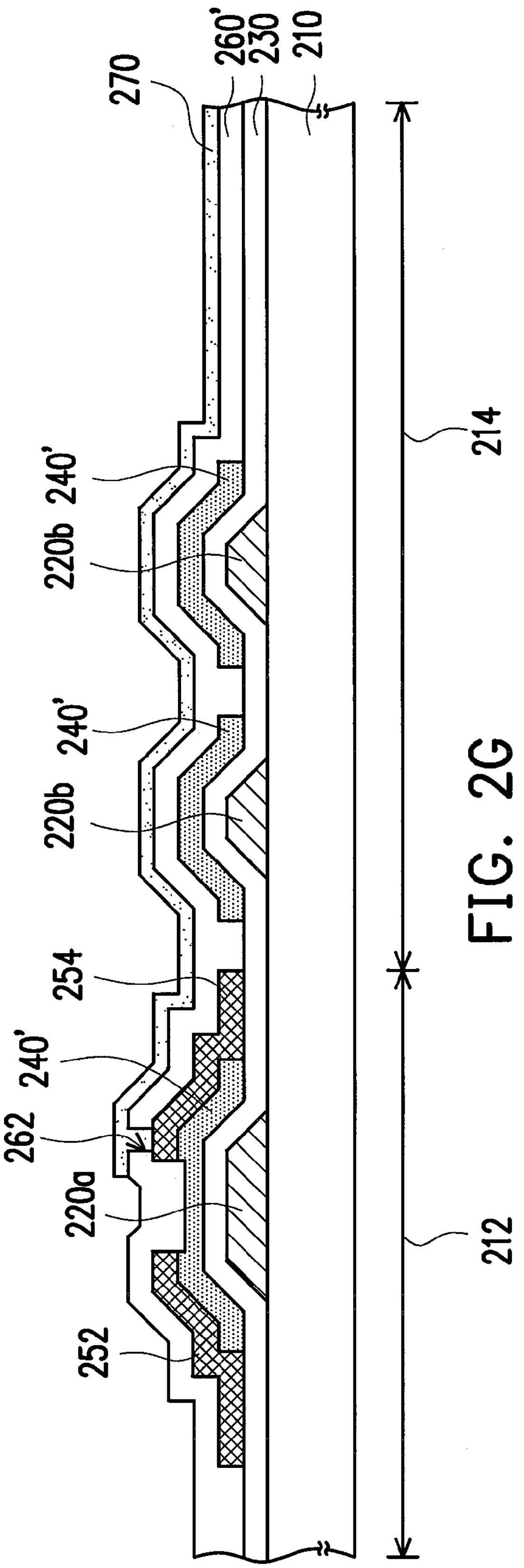

After that, referring to FIG. 2G, a pixel electrode 270 is formed on the substrate 210 and electrically connected to the drain 254. The material of the pixel electrode 270 is a transparent conductive material such as indium tin oxide (ITO) or indium-zinc oxide (IZO), for example. In addition, the pixel electrode 270 is fabricated through a fifth mask process and electrically connected to the drain 254 through the opening 262.

Figure 2H:
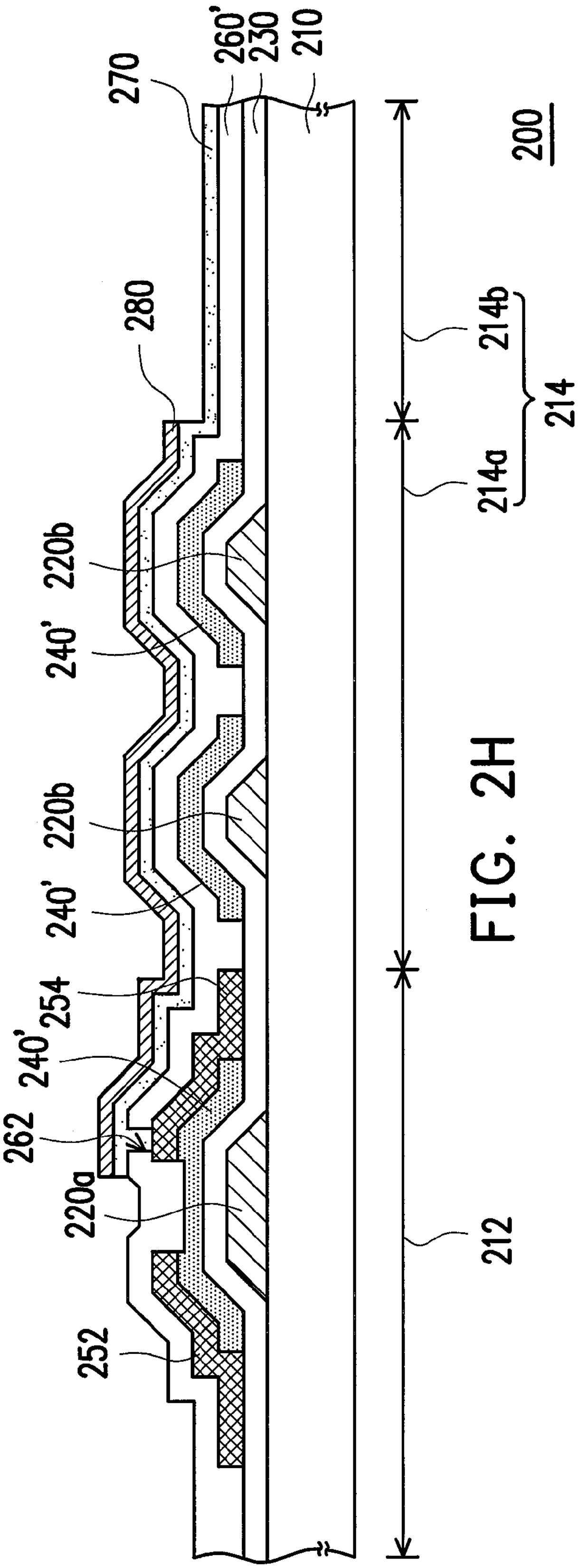

Then, referring to FIG. 2H, a reflective layer 280 is formed on the pixel electrode 270 on top of the bumps 220*b*. The material of the reflective layer 280 may be selected from chromium (Cr), aluminum (Al), titanium (Ti), molybdenum (Mo), tungsten (W), tantalum (Ta), copper (Cu), and a combination of the aforementioned. The reflective layer 280 is fabricated through a sixth mask process. Thus, the fabrication of the pixel structure 200 is hereby completed.

Based on the above, as shown in FIG. 2H, when the reflective layer 280 is only disposed in part of the pixel region 214, the pixel structure 200 is a transflective pixel structure. More specifically, the pixel region 214 includes a reflective region 214*a* and a transparent region 214*b*. The bumps 220*b* are disposed in the reflective region 214*a* and the pixel electrode 270 is extended from the reflective region 214*a* to the transparent region 214*b*. Thus, the reflective layer 280 in the reflective region 214*a* may reflect external light. The pixel electrode 270 in the transparent region 214*b* may use light emitted from the backlight module (not shown) on the backside.

On the other hand, when the reflective layer 280 is disposed in the entire pixel region 214, the pixel structure is a reflective pixel structure (not shown). In particular, the bumps 220*b* may be formed in the entire pixel region 214 including the reflective region 214*a* and the transparent region 214*b* in connection with the step shown in FIG. 2A such that the later formed reflective layer 280 has a good reflection effect.

In summary, the gate 220*a* and the bumps 220*b* may be fabricated at the same time through six mask processes. The surface of the reflective layer 280 is uneven by stacking the layers. Compared to the seven mask processes in the conventional method, the fabricating method of a pixel structure 200 has simplified processes, lowered costs, and increased productivity.

Illustration on the pixel structure 200 according to the above-mentioned fabricating method of a pixel structure continues in the following. Referring to FIG. 2H, the pixel structure 200 comprises the substrate 210, the gate 220*a* as well as the plurality of bumps 220*b*, the gate insulation layer 230, the patterned semiconductor layer 240', the source 252 as well as the drain 254, the patterned protection layer 260', the pixel electrode 270, and the reflective layer 280.

As shown in FIG. 2H, the substrate 210 includes the active device region 212 and the pixel region 214. The gate 220*a* and the bumps 220*b* are disposed on the substrate 210, wherein the gate 220*a* is disposed in the active device region 212 and the bumps 220*b* are disposed in the pixel region 214. The gate insulation layer 230 covers the gate 220*a* and the bumps 220*b*. The patterned semiconductor layer 240' is disposed on the gate insulation layer 230 on top of the gate 220*a* and the bumps 220*b*. The source 252 and the drain 254 are disposed at the two sides of the patterned semiconductor layer 240' on top of the gate 220*a*. The patterned protection layer 260' covers the substrate 210 and exposes part of the drain 254. The pixel electrode 270 is disposed on the substrate 210 and electrically connected to the drain 254. The reflective layer 280 is disposed on the pixel electrode 270 on top of the bumps 220*b*.

Similarly, when the reflective layer 280 is only disposed on the pixel electrode 270 on top of the bumps 220*b*, the pixel structure 200 is a transflective pixel structure. On the other hand, when the reflective layer 280 is disposed on the pixel electrode 270 and in the entire pixel region 214 (not shown in the figure), the pixel structure is a reflective pixel structure. The abovementioned pixel structure 200 is simple and easy to fabricate and thus has low manufacturing costs.

The materials of the various components of the pixel structure 200 and the disposition of the layers have been illustrated in the descriptions of FIGS. 2A~2H, which will not be further described herein.

The Second Embodiment

FIGS. 3A~3G are schematic cross-sectional views illustrating the fabrication processes of a pixel structure according to the second embodiment of the present invention. FIGS. 3A~3G are referenced in sequence in the following.

Figure 3A:
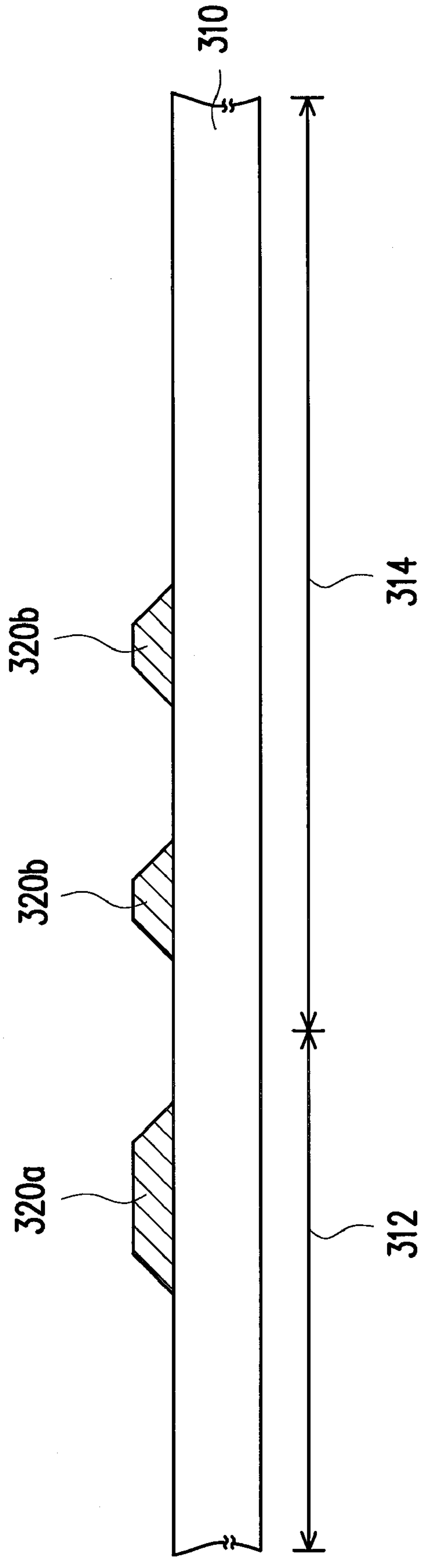
FIGS. 3A~3G are schematic cross-sectional views illustrating the fabrication processes of a pixel structure according to the second embodiment of the present invention.

First, referring to FIG. 3A, a substrate 310 is provided and the substrate 310 comprises an active device region 312 and a pixel region 314. The substrate 310 may be a glass substrate, a silicon substrate, or a substrate of any other similar materials. Next, a gate 320*a* and a plurality of bumps 320*b* are formed on the substrate 310, wherein the gate 320*a* is disposed in the active device region 312 and the bumps 320*b* are disposed in the pixel region 314. The gate 320*a* and the bumps 320*b* are fabricated through a first mask process. The material of the gate 320*a* and the bumps 320*b* may be selected from chromium (Cr), aluminum (Al), titanium (Ti), molybdenum (Mo), tungsten (W), tantalum (Ta), copper (Cu), and a combination of the aforementioned, for example.

Figure 3B:
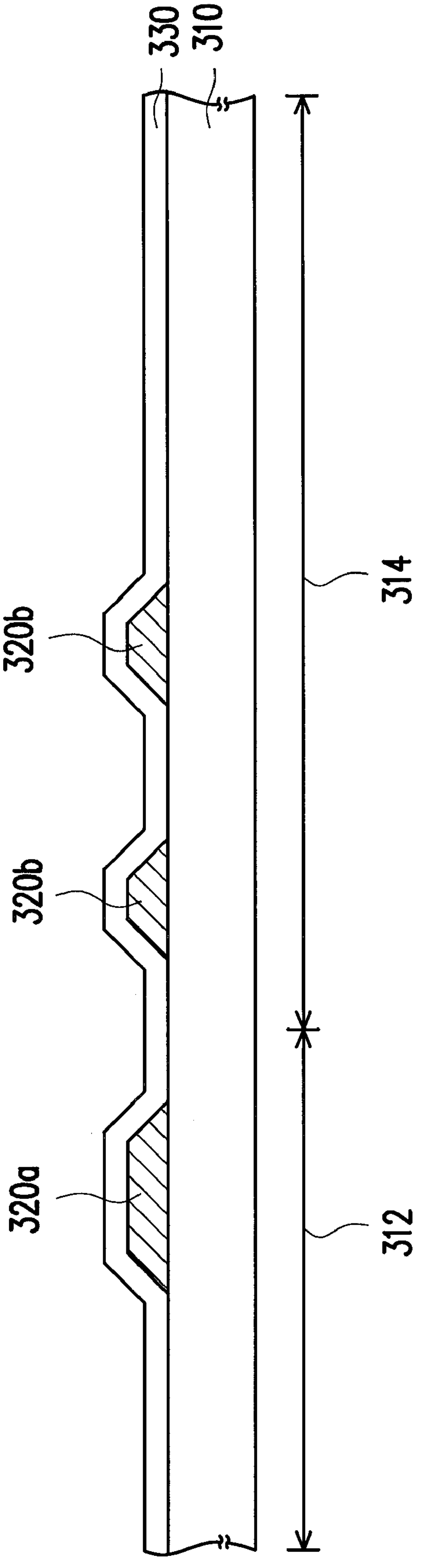

Next, referring to FIG. 3B, a gate insulation layer 330 is formed to cover the gate 320*a* and the bumps 320*b*. The method of forming the gate insulation layer 330 is a chemical vapor deposition process, for example. The material of the gate insulation layer 330 may be silicon oxide, silicon nitride, silicon nitride oxide, or other similar materials, for instance.

Figure 3C:
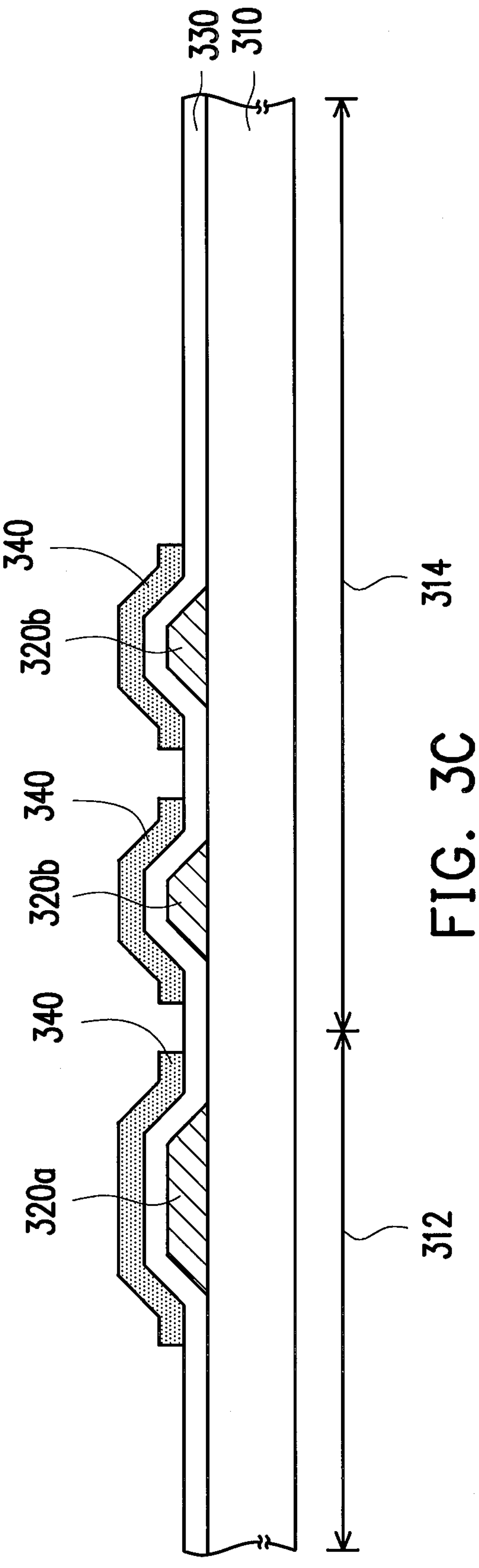

Afterwards, referring to FIG. 3C, a semiconductor layer 340 is formed on the gate insulation layer 330 on top of the gate 320*a* and the bumps 320*b*. The semiconductor layer 340 is fabricated through a second mask process. In addition, the material of the semiconductor layer 340 is amorphous silicon or polysilicon, for example.

Figure 3D:
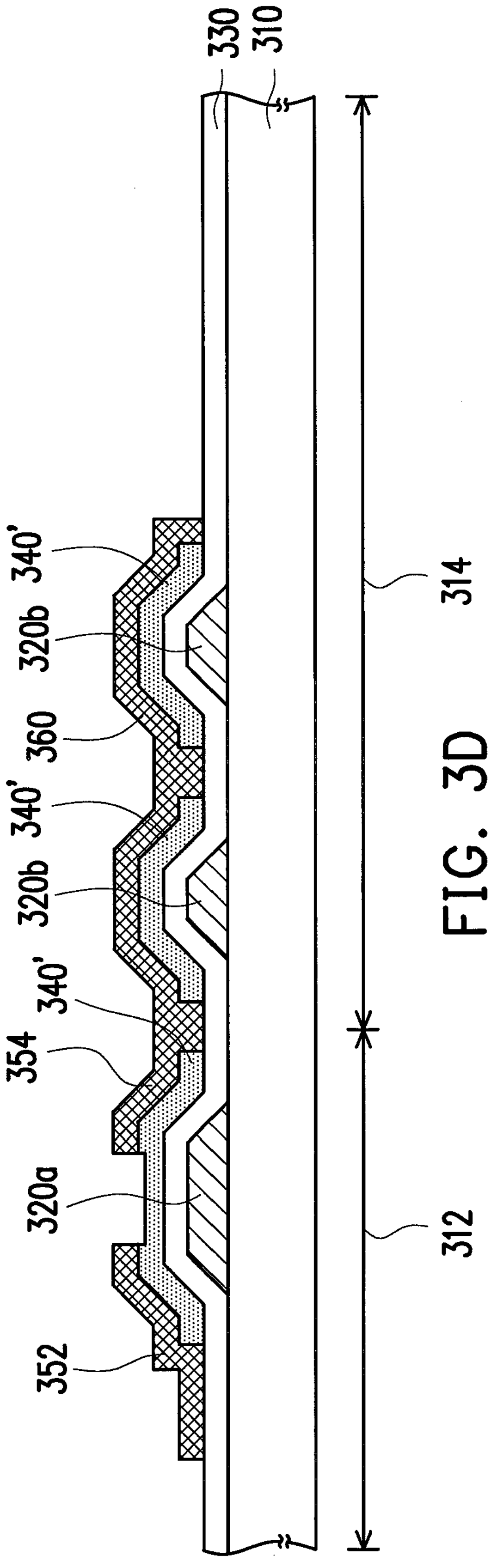

Next, referring to both FIG. 3C and FIG. 3D, a source 352 and a drain 354 are formed at the two sides of the semiconductor layer 340 on top of the gate 320*a* and a reflective layer 360 is formed at the same time to cover the bumps 320*b*. The source 352, the drain 354, and the reflective layer 360 are fabricated through a third mask process. Patterned semiconductor layers 340' are also formed through the said mask (i.e. through the third mask process), wherein the patterned semiconductor layer 340' on top of the gate 320*a* is a channel layer. More specifically, the step of forming the source 352 and the drain 354 at the two sides of the semiconductor layer 340 on top of the gate 320*a* further includes removing the part of the semiconductor layer 340 on top of the gate 320*a* to form a patterned semiconductor layer 340'.

In addition, the material of the source 352, the drain 354 and the reflective layer 360 may be selected from chromium (Cr), aluminum (Al), titanium (Ti), molybdenum (Mo), tungsten (W), tantalum (Ta), copper (Cu), and a combination of the aforementioned. Furthermore, the gate 320*a*, the source 352, and the drain 354 constitute a thin film transistor. What is different from the abovementioned first embodiment is that the reflective layer 360 is simultaneously formed in the third mask process.

In particular, as shown in FIG. 3D, the reflective layer 360 and the drain 354 are the same layer, and are interconnected. However, in other embodiments, the reflective layer 360 and the drain 354 may be separated from each other (not shown in the figure).

Figure 3E:
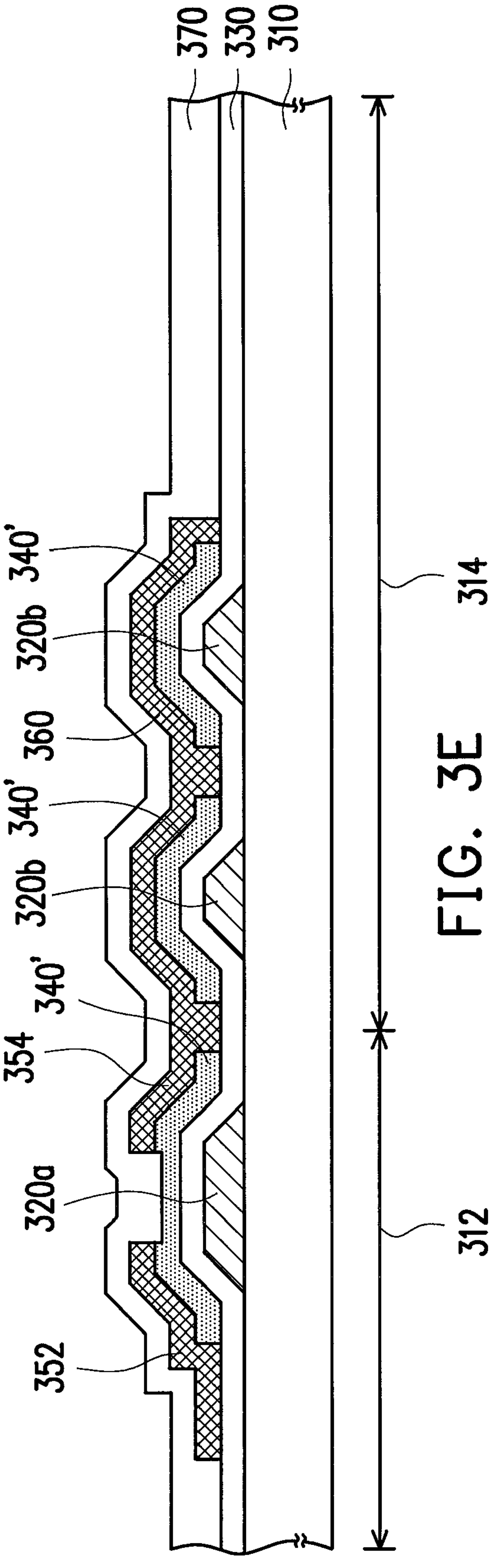
Figure 3F:
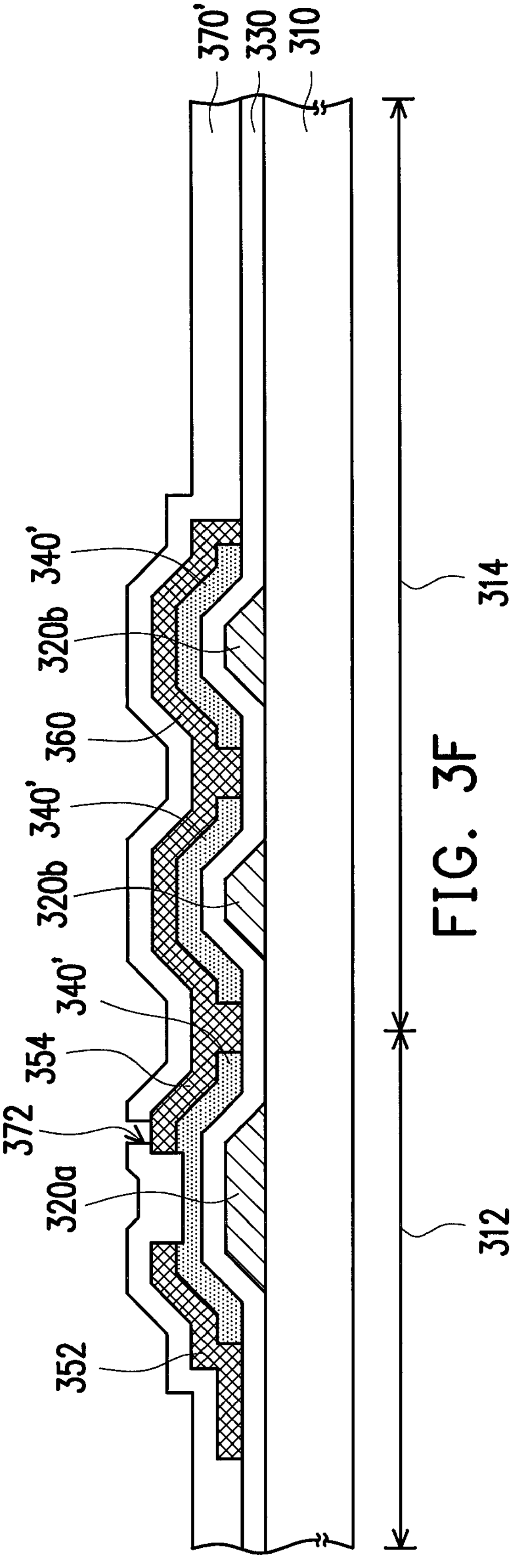

Then, referring to both FIG. 3E and FIG. 3F, a patterned protection layer 370' is formed to cover the substrate 310, and the patterned protection layer 370' exposes part of the drain 354. The material of the patterned protection layer 370' is inorganic material, for example. More specifically, as shown in FIG. 3E, first, a protection layer 370 is formed on the substrate 310 using the chemical vapor deposition process. Then, as shown in FIG. 3F, an opening 372 is formed in the protection layer 370 through a fourth mask process such that the patterned protection layer 370' exposes the drain 354.

In particular, the material of the patterned protection layer 370' is inorganic material as compared to the organic material of the protection layer 160 in the conventional method. Thus, the said step does not require changing current fabrication parameters and the fabrication process is simplified. Furthermore, the material of the patterned protection layer 370' may be a transparent and inorganic material so that the reflective layer 360 may more effectively reflect external light.

Figure 3G:
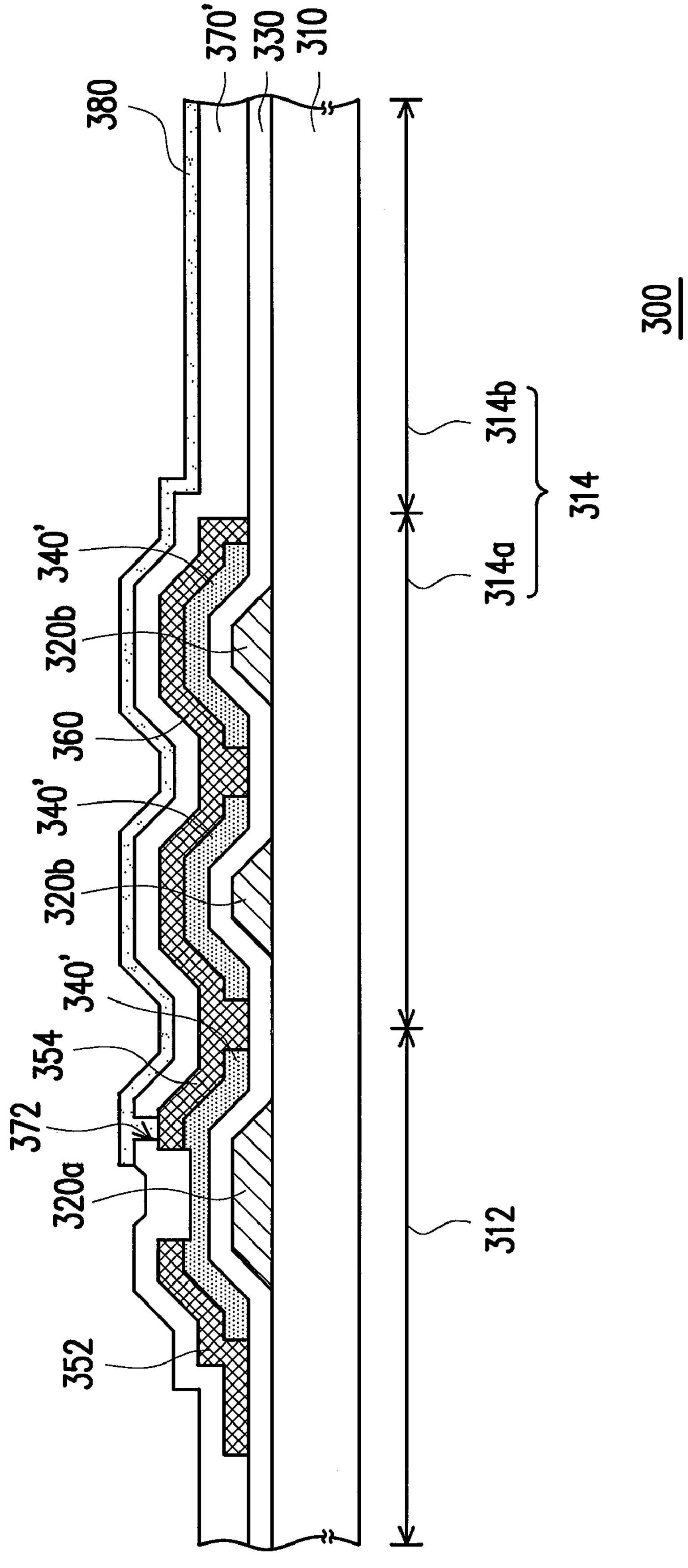

After that, referring to FIG. 3G, a pixel electrode 380 is formed on the substrate 310 and electrically connected to the drain 354. The material of the pixel electrode 380 is a transparent conductive material such as indium tin oxide (ITO) or indium-zinc oxide (IZO), for example. In addition, the pixel electrode 380 is fabricated through a fifth mask process and electrically connected to the drain 354 through the opening 372.

It should be noted that, as shown in FIG. 3G, when the reflective layer 360 is only disposed in part of the pixel region 314, the pixel structure 300 is a transflective pixel structure. More specifically, the pixel region 314 includes a reflective region 314*a* and a transparent region 314*b*. The bumps 320*b* are disposed in the reflective region 314*a* and the pixel electrode 380 is extended from the reflective region 314*a* to the transparent region 314*b*. Thus, the reflective layer 360 in the reflective region 314*a* may reflect external light. The pixel electrode 380 in the transparent region 314*b* may use light emitted from the backlight module (not shown) on the backside.

On the other hand, the reflective layer 360 may also be disposed in the entire pixel region 314. In this case, the pixel structure is a reflective pixel structure (not shown). In particular, the bumps 320*b* may be formed in the entire pixel region 314 in connection with the step shown in FIG. 3A such that the later formed reflective layer 360 has a better reflection effect.

From the above, the fabricating method of a pixel structure uses five mask processes to form the transflective or reflective pixel structure and thus simplify the fabrication processes and lower the costs. In other words, using the original mask processes of fabricating the thin film transistor, the source 320*a* and the bumps 320*b* are simultaneously formed and so are the source 352, the drain 354, and the reflective layer 360. Thus, no additional mask process is required to form the uneven surface of the reflective layer 360.

Illustration on the pixel structure 300 according to the above-mentioned fabricating method of a pixel structure continues in the following. Referring to FIG. 3G again, the pixel structure 300 comprises the substrate 310, the gate 320*a* as well as the plurality of bumps 320*b*, the gate insulation layer 330, the patterned semiconductor layer 340', the source 352 as well as the drain 354, the patterned protection layer 370', the pixel electrode 380, and the reflective layer 360.

Referring to FIG. 3G, the substrate 310 includes the active device region 312 and the pixel region 314. The gate 320*a* and the bumps 320*b* are disposed on the substrate 310, wherein the gate 320*a* is disposed in the active device region 312 and the bumps 320*b* are disposed in the pixel region 314. The gate insulation layer 330 covers the gate 320*a* and the bumps 320*b*. The patterned semiconductor layer 340' is disposed on the gate insulation layer 330 on top of the gate 320*a* and the bumps 320*b*. The source 352 and the drain 354 are disposed at the two sides of the patterned semiconductor layer 340' on top of the gate 320*a*. The patterned protection layer 370' covers the substrate 310 and exposes part of the drain 354. The pixel electrode 380 is disposed on the substrate 310 and electrically connected to the drain 354. The reflective layer 360 is disposed between the patterned semiconductor layer 340' and the patterned protection layer 370' on top of the bumps 320*b*.

As shown in FIG. 3G, when the reflective layer 360 is disposed between the patterned semiconductor layer 340' and the patterned protection layer 370' on top of the bumps 320*b*, the reflective layer 360 and the drain 354 are the same layer, and are interconnected. Certainly, the reflective layer 360 and the drain 354 may be separated from each other (not shown).

It should be noted that the pixel structure 300 may be the transflective or reflective pixel structure.

When the pixel structure 300 is the transflective pixel structure, the pixel region 314 may include a reflective region 314*a* and a transparent region 314*b*. The bumps 320*b* are disposed in the reflective region 314*a* and the pixel electrode 380 is extended from the reflective region 314*a* to the transparent region 314*b*.

Certainly, the reflective layer 360 may be disposed in the entire pixel region 314 to make the pixel structure 300 a reflective pixel structure (not shown). More specifically, the reflective layer 360 may be extended in the entire pixel region 314 (not shown in the figure) when forming the source 352, the drain 354, and the reflective layer 360 in connection with the third mask process shown in FIG. 3D. That is, the reflective layer 360 is extended into the reflective region 314*a* and the transparent region 314*b*. The abovementioned pixel structure 300 is simple and easy to fabricate and thus has low manufacturing costs.

Third Embodiment

FIGS. 4A~4G are schematic cross-sectional views illustrating the fabrication processes of a pixel structure according to the third embodiment of the present invention. FIGS. 4A~4G are referenced in sequence in the following.

Figure 4A:
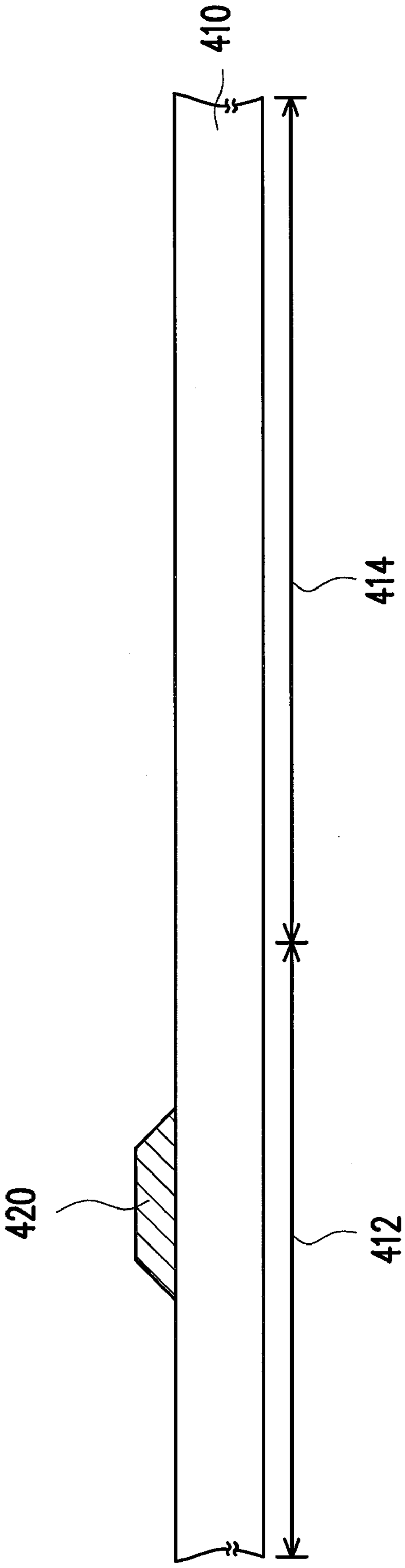
FIGS. 4A~4G are schematic cross-sectional views illustrating the fabrication processes of a pixel structure according to the third embodiment of the present invention.

First, referring to FIG. 4A, a substrate 410 is provided and the substrate 410 comprises an active device region 412 and a pixel region 414. The substrate 410 may be a glass substrate, a silicon substrate, or a substrate of any other similar materials. Next, a gate 420 is formed on the substrate 410 and in the active device region 412. The gate 420 is fabricated through a first mask process. The material of the gate 420 may be selected from chromium (Cr), aluminum (Al), titanium (Ti), molybdenum (Mo), tungsten (W), tantalum (Ta), copper (Cu), and a combination of the aforementioned, for example. In particular, only the gate 420 is formed in the first mask process.

Figure 4B:
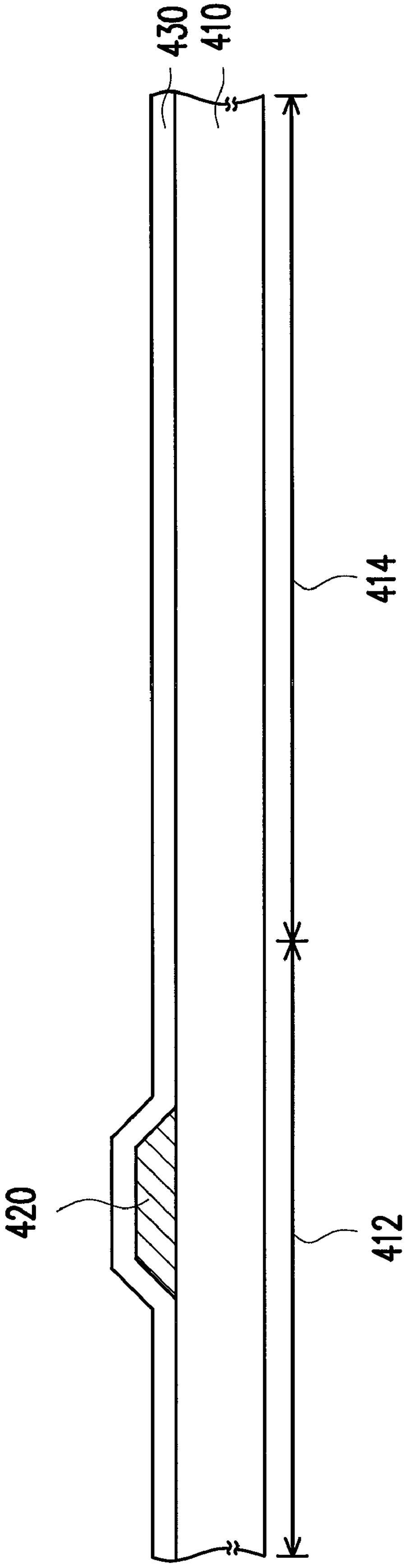

Next, referring to FIG. 4B, a gate insulation layer 430 is formed to cover the gate 420. The method of forming the gate insulation layer 430 is a chemical vapor deposition process, for example. The material of the gate insulation layer 430 may be silicon oxide, silicon nitride, silicon nitride oxide, or other similar materials, for instance.

Figure 4C:
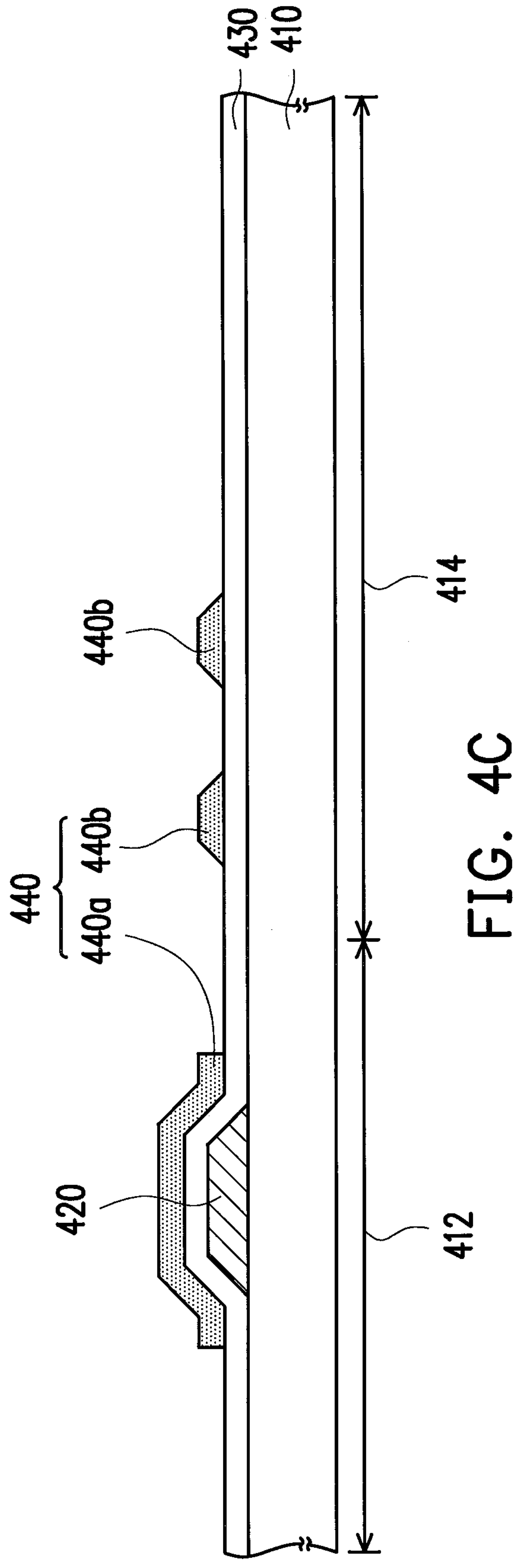

Afterwards, referring to FIG. 4C, a semiconductor layer 440 is formed on the gate insulation layer 430, wherein the semiconductor layer 440 comprises a channel layer 440*a* and a plurality of bumps 440*b*. The channel layer 440*a* is disposed on the gate insulation layer 430 on top of the gate 420 and the bumps 440*b* are disposed on the gate insulation layer 430 in the pixel region 414. The semiconductor layer 440 is fabricated through a second mask process. In addition, the material of the semiconductor layer 440 is amorphous silicon or polysilicon, for example. What is different from the above first and second embodiments is that the channel layer 440*a* and the bumps 440*b* are formed at the same time in the second mask process.

Figure 4D:
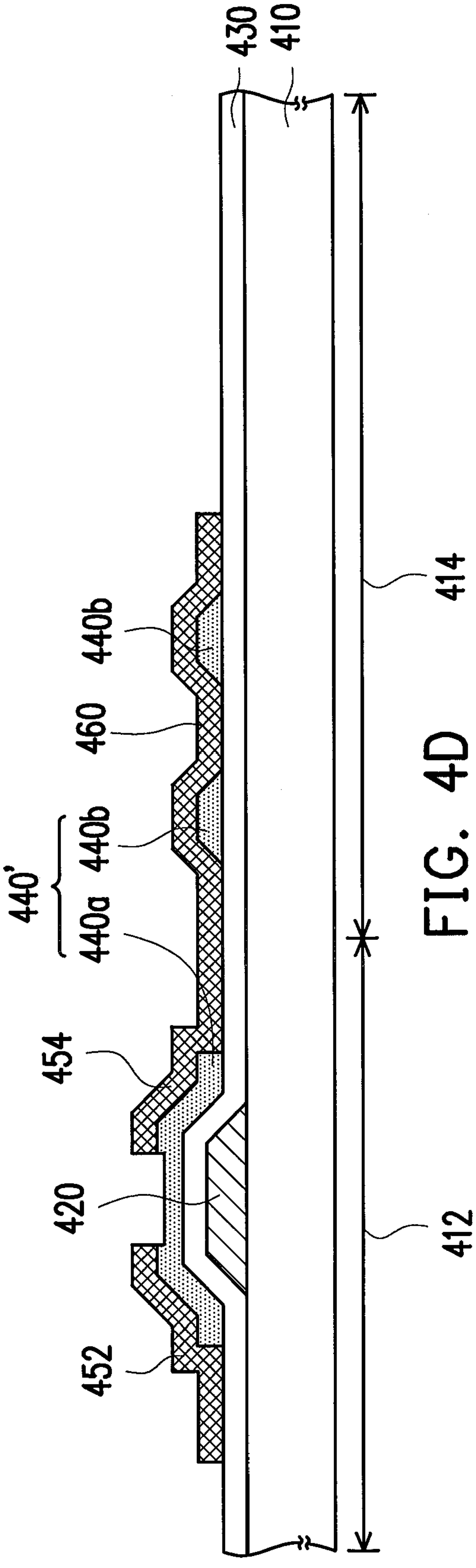

Then, referring to FIG. 4D, a source 452 and a drain 454 are formed at the two sides of the channel layer 440*a* and a reflective layer 460 is formed at the same time to cover the bumps 440*b*. The source 452, the drain 454, and the reflective layer 460 are formed through a third mask process. Through the third mask process, a patterned semiconductor layer 440' is also formed. More specifically, the step of forming the source 452 and the drain 454 at the two sides of the channel layer 440*a* and forming the reflective layer 460 to cover the bumps 440*b* further includes removing the part of the semiconductor layer 440 on top of the gate 420 to form the patterned semiconductor layer 440'. In addition, the material of the source 452, the drain 454 and the reflective layer 460 may be selected from chromium (Cr), aluminum (Al), titanium (Ti), molybdenum (Mo), tungsten (W), tantalum (Ta), copper (Cu), and a combination of the aforementioned, for example. Furthermore, the gate 420, the source 452, and the drain 454 constitute a thin film transistor. In particular, as shown in FIG.

4D, the reflective layer 460 and the drain 454 are the same layer, and are interconnected. However, in other embodiments, the reflective layer 460 and the drain 454 may be separated from each other (not shown in the figure).

Figure 4E:
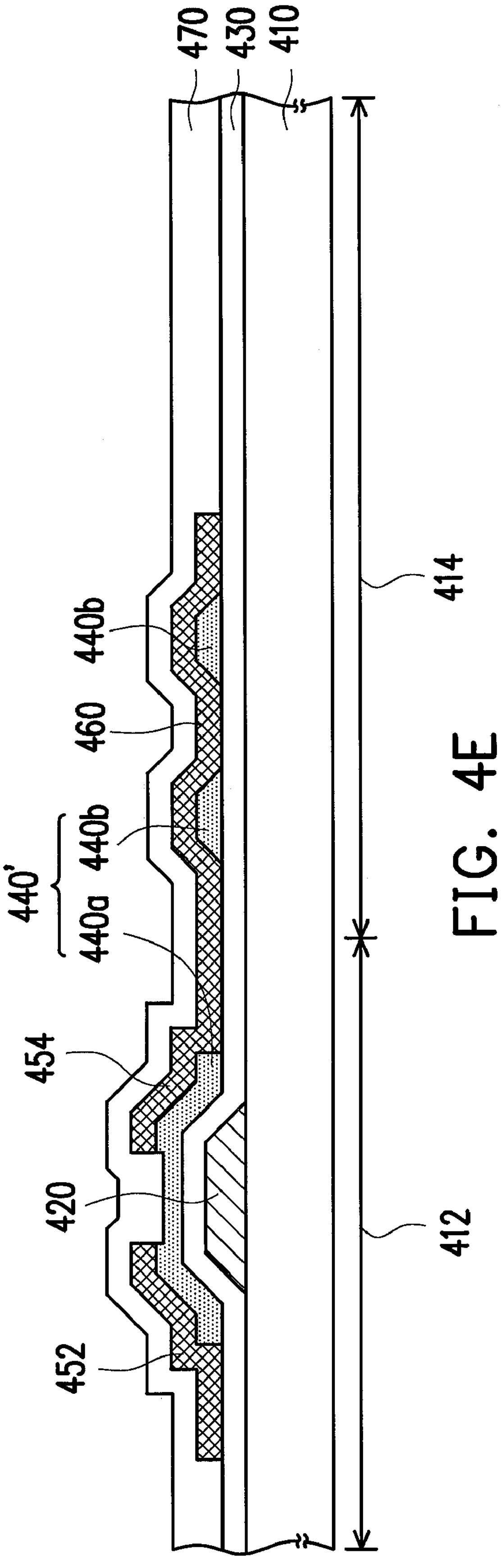
Figure 4F:
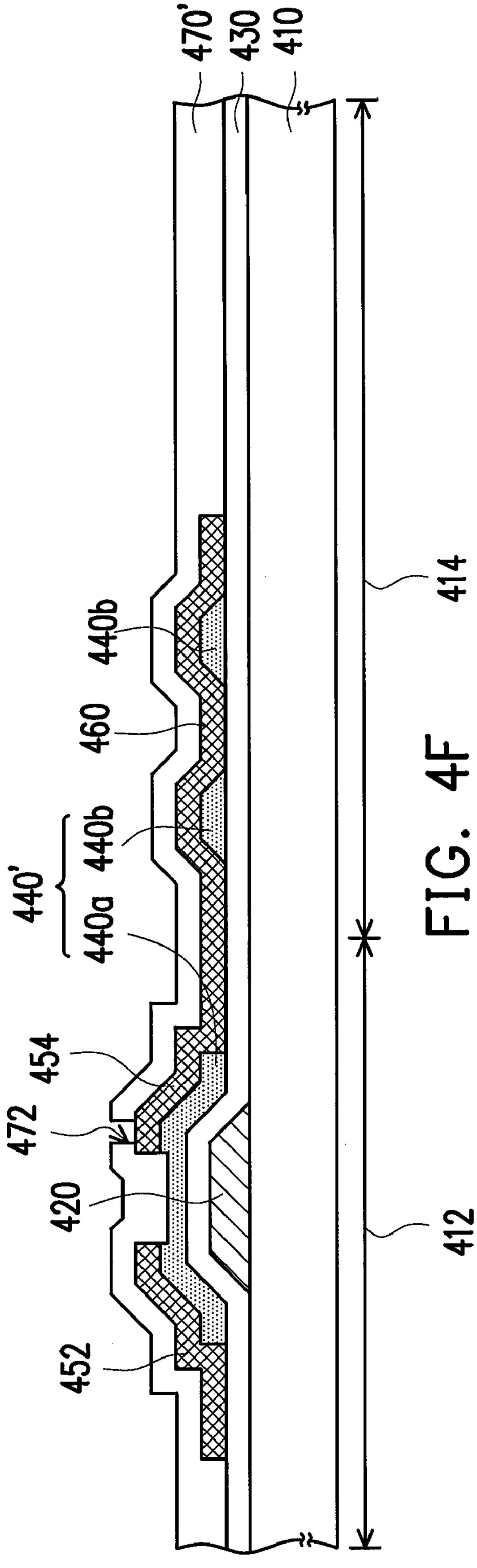

Then, referring to both FIG. 4E and FIG. 4F, a patterned protection layer 470' is formed to cover the substrate 410 and the patterned protection layer 470' exposes part of the drain 454. The material of the patterned protection layer 470' is inorganic material, for example. More specifically, as shown in FIG. 4E, a protection layer 470 is formed on the substrate 410 using the chemical vapor deposition process. Then, as shown in FIG. 4F, an opening 472 is formed in the protection layer 470 through a fourth mask process such that the patterned protection layer 470' exposes the drain 454.

In particular, the material of the patterned protection layer 470' is inorganic material as compared to the organic material of the protection layer 160 in the conventional method. Thus, the said step does not require changing current fabrication parameters and the fabrication process is simplified. Furthermore, the material of the patterned protection layer 470' may be a transparent and inorganic material so that the reflective layer 460 may more effectively reflect external light.

Figure 4G:
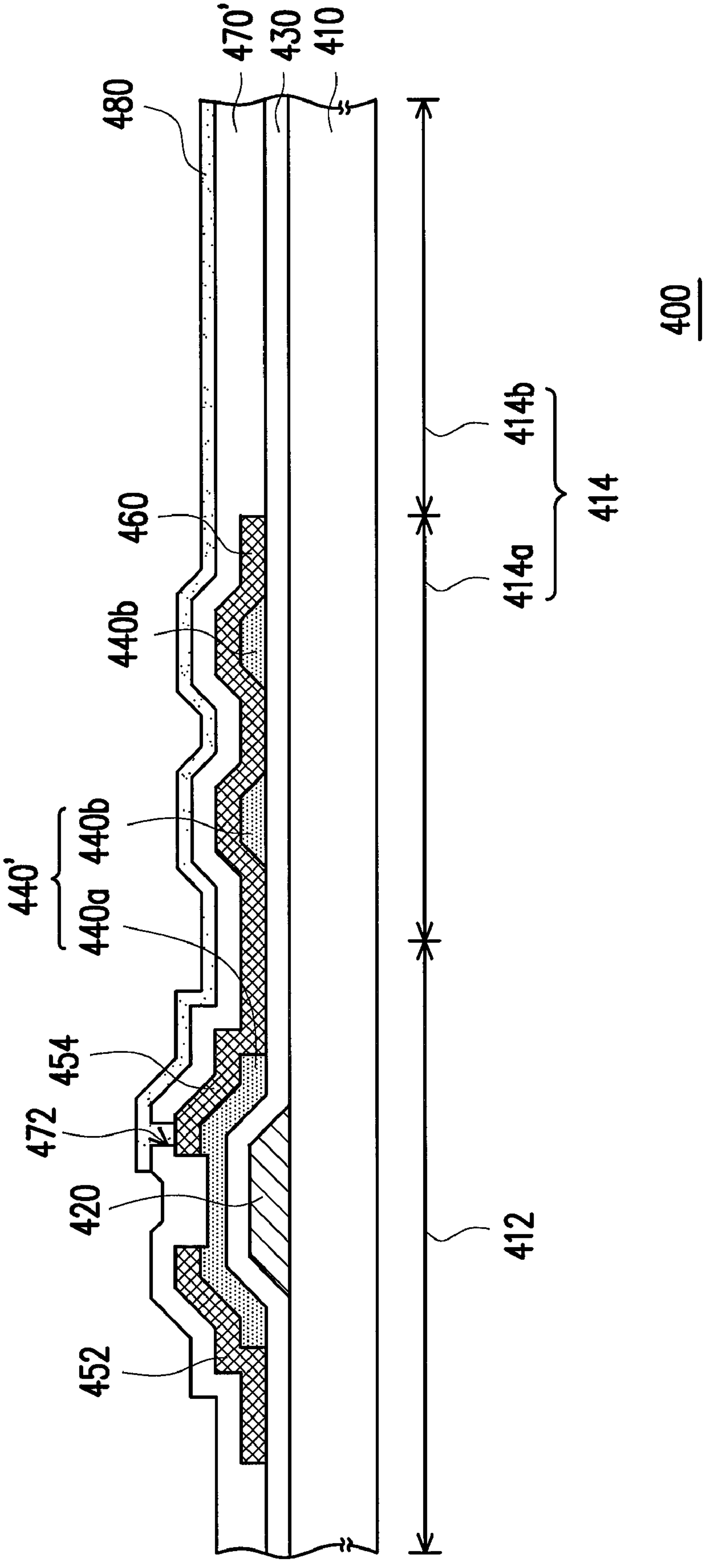

After that, referring to FIG. 4G, a pixel electrode 480 is formed on the substrate 410 and electrically connected to the drain 454. The material of the pixel electrode 480 is a transparent conductive material such as indium tin oxide (ITO) or indium-zinc oxide (IZO), for example. In addition, the pixel electrode 480 is fabricated through a fifth mask process and electrically connected to the drain 454 through the opening 472.

From the above, as shown in FIG. 4G, when the reflective layer 460 is only disposed in part of the pixel region 414, the pixel structure 400 is a transflective pixel structure. More specifically, the pixel region 414 includes a reflective region 414*a* and a transparent region 414*b*. The bumps 440*b* are disposed in the reflective region 414*a* and the pixel electrode 480 is extended from the reflective region 414*a* to the transparent region 414*b*. Thus, the reflective layer 460 in the reflective region 414*a* may reflect external light. The pixel electrode 480 in the transparent region 414*b* may use light emitted from the backlight module (not shown) on the backside.

On the other hand, the reflective layer 460 may be disposed in the entire pixel region 414. Then, the pixel structure is a reflective pixel structure (not shown). In particular, the bumps 440*b* may be formed in the entire pixel region 414 in connection with the step shown in FIG. 4C such that the later formed reflective layer 460 has a better reflection effect.

From the above, the fabricating method of a pixel structure uses five mask processes to form the transflective or reflective pixel structure and thus simplifies the fabrication processes and lowers the costs. In other words, using the original mask processes of fabricating the thin film transistor, the channel layer 440*a* and the bumps 440*b* are simultaneously formed and so are the source 452, the drain 454, and the reflective layer 460. Thus, no additional mask process is required to form the uneven surface of the reflective layer 460.

Illustration on the pixel structure 400 according to the above-mentioned fabricating method of a pixel structure continues in the following. Referring to FIG. 4G again, the pixel structure 400 comprises the substrate 410, the gate 420, the gate insulation layer 430, the patterned semiconductor layer 440', the source 452 as well as the drain 454, the patterned protection layer 470', the pixel electrode 480, and the reflective layer 460.

As shown in FIG. 4G, the substrate 410 includes the active device region 412 and the pixel region 414. The gate 420 is disposed on the substrate 410 and in the active device region 412. The gate insulation layer 430 covers the gate 420. The patterned semiconductor layer 440' is formed on the gate insulation layer 430, wherein the patterned semiconductor layer 440' comprises a channel layer 440*a* and a plurality of bumps 440*b*. The channel layer 440*a* is disposed on the gate insulation layer 430 on top of the gate 420 and the bumps 440*b* are disposed on the gate insulation layer 430 in the pixel region 414. The source 452 and the drain 454 are disposed at the two sides of the channel layer 440*a*. The patterned protection layer 470' covers the substrate 410 and exposes part of the drain 454. The pixel electrode 480 is disposed on the substrate 410 and electrically connected to the drain 454. The reflective layer 460 covers the bumps 440*b* and is disposed between the bumps 440*b* and the patterned protection layer 470'.

As shown in FIG. 4G, when the reflective layer 460 is disposed between the bumps 440*b* and the patterned protection layer 470', the reflective layer 460 and the drain 454 are the same layer, and are interconnected. Certainly, the reflective layer 460 and the drain 454 may be separated from each other (not shown).

Furthermore, when the pixel structure 400 is the transflective pixel structure, the pixel region 414 may include a reflective region 414*a* and a transparent region 414*b*. The bumps 440*b* are disposed in the reflective region 414*a* and the pixel electrode 480 is extended from the reflective region 414*a* to the transparent region 414*b*.

Certainly, the reflective layer 460 may be disposed in the entire pixel region 414 to make the pixel structure a reflective pixel structure (not shown). More specifically, the reflective layer 460 may be extended in the entire pixel region 414 (not shown in the figure) when forming the source 452, the drain 454, and the reflective layer 460 in connection with the third mask process shown in FIG. 4D. That is, the reflective layer 460 is extended into the reflective region 414*a* and the transparent region 414*b*. In this case, the pixel structure 400 is a reflective pixel structure. The abovementioned pixel structure 400 is simple and easy to fabricate and thus has low manufacturing costs.

In summary, the pixel structure of the present invention and the fabricating method thereof possess at least the advantages as follows.

(1) Using the original mask processes of fabricating the thin film transistor, the source and the bumps are simultaneously formed, the channel layer and the bumps are simultaneous formed, or the source, the drain, and the reflective layer are simultaneously formed. Thus, no additional mask process is required to form the uneven surface of the reflective layer.

(2) The material of the protection layer is inorganic material as compared to the organic material of the protection layer in the conventional method. Thus, it is not required to change current fabrication processes. In addition, the surface of the reflective layer is easily made uneven when using inorganic material by stacking the layers.

(3) The fabricating method of a pixel structure uses fewer mask processes so the fabrication processes are simple and the mask costs are low.

(4) The present invention provides a pixel structure which facilitates simultaneous fabrication of the thin film transistor and the reflective layer with an uneven surface.

It will be apparent to those of ordinary skills in the technical field that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A fabricating method of a pixel structure, comprising:

providing a substrate, the substrate comprising an active device region and a pixel region;

forming a gate and a plurality of bumps on the substrate, wherein the gate is disposed in the active device region and the bumps are disposed in the pixel region;

forming a gate insulation layer to cover the gate and the bumps;

forming a semiconductor layer on the gate insulation layer on top of the gate and the bumps;

forming a source and a drain at the two sides of the semiconductor layer on top of the gate and forming a reflective layer at the same time to cover the bumps, wherein the reflective layer and the drain are the same layer, and are interconnected;

forming a patterned protection layer to cover the substrate, wherein the patterned protection layer exposes part of the drain; and forming a pixel electrode on the substrate, wherein the pixel electrode is electrically connected to the drain.

2. The fabricating method of a pixel structure according to claim 1, wherein the material of the reflective layer may be selected from chromium (Cr), aluminum (Al), titanium (Ti), molybdenum (Mo), tungsten (W), tantalum (Ta), copper (Cu), and a combination of the aforementioned.

3. The fabricating method of a pixel structure according to claim 1, wherein the pixel region comprises a reflective region and a transparent region, the bumps are disposed in the reflective region, and the pixel electrode is extended from the reflective region to the transparent region.

4. The fabricating method of a pixel structure according to claim 1, wherein a material of the patterned protection layer comprises inorganic material.

5. The fabricating method of a pixel structure according to claim 1, wherein the step of forming the source and the drain at the two sides of the semiconductor layer on top of the gate further includes, removing the part of the semiconductor layer on top of the gate to form a patterned semiconductor layer.

6. A pixel structure, comprising:

a substrate, comprising an active device region and a pixel region;

a gate and a plurality of bumps, disposed on the substrate, wherein the gate is disposed in the active device region and the bumps are disposed in the pixel region;

a gate insulation layer, covering the gate and the bumps;

a patterned semiconductor layer, disposed on the gate insulation layer on top of the gate and the bumps;

a source and a drain, disposed at the two sides of the patterned semiconductor layer on top of the gate;

a patterned protection layer, covering the substrate and exposing part of the drain;

a pixel electrode, disposed on the substrate, wherein the pixel electrode is electrically connected to the drain; and a reflective layer, disposed either on the pixel electrode on top of the bumps or between the patterned semiconductor layer and the patterned protection layer which are also on top of the bumps, wherein the reflective layer and the drain are the same layer, and are interconnected.

7. The pixel structure according to claim 6, wherein the material of the reflective layer may be selected from chromium (Cr), aluminum (Al), titanium (Ti), molybdenum (Mo), tungsten (W), tantalum (Ta), copper (Cu), and a combination of the aforementioned.

8. The pixel structure according to claim 6, wherein the pixel region comprises a reflective region and a transparent region, the bumps are disposed in the reflective region, and the pixel electrode is extended from the reflective region to the transparent region.

9. The pixel structure according to claim 6, wherein a material of the patterned protection layer comprises inorganic material.

10. A fabricating method of a pixel structure, comprising:

providing a substrate, the substrate comprising an active device region and a pixel region;

forming a gate on the substrate and in the active device region;

forming a gate insulation layer to cover the gate;

forming a semiconductor layer on the gate insulation layer, wherein the semiconductor layer comprises a channel layer and a plurality of bumps, the channel layer is disposed on the gate insulation layer on top of the gate, and the bumps are disposed on the gate insulation layer in the pixel region;

forming a source and a drain at the two sides of the channel layer and forming a reflective layer at the same time to cover the bumps, wherein the reflective layer and the drain are the same layer, and are interconnected;

forming a patterned protection layer to cover the substrate, wherein the patterned protection layer exposes part of the drain; and forming a pixel electrode on the substrate, wherein the pixel electrode is electrically connected to the drain.

11. The fabricating method of a pixel structure according to claim 10, wherein a material of the reflective layer may be selected from chromium (Cr), aluminum (Al), titanium (Ti), molybdenum (Mo), tungsten (W), tantalum (Ta), copper (Cu), and a combination of the aforementioned.

12. The fabricating method of a pixel structure according to claim 10, wherein the pixel region comprises a reflective region and a transparent region, the bumps are disposed in the reflective region, and the pixel electrode is extended from the reflective region to the transparent region.

13. The fabricating method of a pixel structure according to claim 10, wherein a material of the patterned protection layer comprises inorganic material.

14. The fabricating method of a pixel structure according to claim 10, wherein the step of forming the source and the drain at the two sides of the semiconductor layer on top of the gate further includes, removing the part of the semiconductor layer on top of the gate to form a patterned semiconductor layer.

15. A pixel structure, comprising:

a substrate, comprising an active device region and a pixel region;

a gate, disposed on the substrate and in the active device region;

a gate insulation layer, covering the gate;

a patterned semiconductor layer, disposed on the gate insulation layer, wherein the patterned semiconductor layer comprises a channel layer and a plurality of bumps, the channel layer is disposed on the gate insulation layer on top of the gate, and the bumps are disposed on the gate insulation layer in the pixel region;

a source and a drain, disposed at the two sides of the channel layer;

a patterned protection layer, covering the substrate and exposing part of the drain;

a pixel electrode, disposed on the substrate, wherein the pixel electrode is electrically connected to the drain; and a reflective layer, covering the bumps and disposed between the bumps and the patterned protection layer, wherein the reflective layer and the drain are the same layer, and are interconnected.

16. The pixel structure according to claim 15, wherein a material of the reflective layer may be selected from chromium (Cr), aluminum (Al), titanium (Ti), molybdenum (Mo), tungsten (W), tantalum (Ta), copper (Cu), and a combination of the aforementioned.

17. The pixel structure according to claim 15, wherein the pixel region comprises a reflective region and a transparent region, the bumps are disposed in the reflective region, and the pixel electrode is extended from the reflective region to the transparent region.

18. The pixel structure according to claim 15, wherein a material of the patterned protection layer comprises inorganic material.

* * * * *